United States Patent [19]
Fedele et al.

[11] Patent Number: 4,706,260
[45] Date of Patent: Nov. 10, 1987

[54] DPCM SYSTEM WITH RATE-OF-FILL CONTROL OF BUFFER OCCUPANCY

[75] Inventors: Nicola J. Fedele, Kingston, N.J.; Alfonse A. Acampora, Staten Island, N.Y.

[73] Assignee: RCA Corporation, Princeton, N.J.

[21] Appl. No.: 928,042

[22] Filed: Nov. 7, 1986

[51] Int. Cl.[4] .............................................. H04N 7/13
[52] U.S. Cl. ...................................... 375/27; 358/133; 382/56
[58] Field of Search ........................ 375/27, 122, 118; 370/108; 358/13, 135, 136, 138, 261; 382/43, 50, 56; 360/7; 369/60

[56] References Cited

U.S. PATENT DOCUMENTS

| | | | |
|---|---|---|---|
| 3,670,096 | 6/1972 | Candy et al. | 358/136 |
| 4,047,221 | 6/1977 | Yasuda et al. | 358/136 |
| 4,051,530 | 9/1977 | Kuroda et al. | 358/136 |
| 4,077,053 | 2/1978 | Ishiguro | 358/136 |
| 4,093,962 | 6/1978 | Ishiguro et al. | 358/138 |
| 4,202,011 | 5/1980 | Koga | 358/136 |
| 4,217,609 | 8/1980 | Hatori et al. | 358/136 |
| 4,302,775 | 11/1981 | Widergren et al. | 358/136 |
| 4,454,546 | 6/1984 | Mori | 382/56 |
| 4,460,923 | 7/1984 | Hirano et al. | 358/136 |
| 4,488,175 | 12/1984 | Netravali | 358/136 |
| 4,517,596 | 5/1985 | Suzuki | 358/13 |
| 4,541,012 | 9/1985 | Tescher | 358/133 |
| 4,562,468 | 12/1985 | Koga | 358/136 |

OTHER PUBLICATIONS

The article "Picture Coding: A Review" by Netravali et al., published at pp. 366–406 of the Proceedings of the IEEE, vol. 68, No. 3, Mar. 1980.

Primary Examiner—Benedict V. Safourek
Attorney, Agent, or Firm—Allen LeRoy Limberg; Henry I. Steckler; William H. Meise

[57] ABSTRACT

In a differential pulse code modulator for image-representative signals, a coder codes difference signals to produce coded signals which have a highly variable rate, which depends upon motion in the image being represented. A rate buffer receives the coded signals and generates a control signal representative, at least in part, of the rate of fill of the rate buffer. Various filters, decimators and/or coarse quantizers associated with the modulator have characteristics controlled by the control signal in order to tend to control the rate of fill of the rate buffer. This aids in preventing loss of information at the receiver.

22 Claims, 14 Drawing Figures

| FILL, PERCENT | I | II | III | IV | V | VI | VII | |
|---|---|---|---|---|---|---|---|---|
| 31–37 | 011111 | $Q_2$ | $Q_2$ $SD_2$ | $Q_2$ $SD_2$ | $Q_3$ $SD_2$ | $Q_3$ $SD_2$ $TD_2$ | $Q_3$ $SD_2$ $TD_2$ | A |
| 25–31 | 001111 | | $Q_2$ | $Q_2$ $SD_2$ | $Q_2$ $SD$ | $Q_3$ $SD_2$ | $Q_3$ $SD_2$ $TD_2$ | B |
| 19–25 | 000111 | | | $Q_2$ $SD_2$ | $Q_2$ $SD_2$ | $Q_2$ $SD_2$ | $Q_3$ $SD_2$ | C |
| 12–19 | 000011 | | | $Q_2$ | $Q_2$ | $Q_2$ $SD_2$ | $Q_2$ $SD_2$ | D |
| 6–12 | 000001 | | | | $Q_2$ | $Q_2$ | $Q_2$ $SD_2$ | E |
| 0–6 | 000000 | | | | | | $Q_2$ | F |
| | | 000000 | 000001 | 000011 | 000111 | 001111 | 011111 | G |
| | | 0–20 | 20–32 | 32–52 | 52–64 | 64–80 | 80–100 | |

RATE, BYTES/LINE

*Fig. 4a*

DPCM SYSTEM WITH RATE-OF-FILL CONTROL OF BUFFER OCCUPANCY

This invention relates to differential pulse code modulation (DPCM) data rate reduction systems, and more particularly to such systems which control the occupancy of the rate buffer by control of the rate of data flow thereto.

BACKGROUND OF THE INVENTION

The transmission of television signals in our society is widespread. The type of television transmission most familiar to the public is conventional broadcast television which occurs on VHF and UHF television channels. These television channels each have an assigned bandwidth of 6 megahertz (MHz). In some areas of the country, it would be desirable to have additional channel capacity available, as by the use of narrower channel bandwidth. While it is technologically feasible to significantly reduce the bandwidth required for conventional television broadcasting by modern coding methods, the enormous cost of changing millions of television receivers to accommodate this coding is prohibitive.

In addition to terrestrial broadcast, there are many other uses of broadcast or point-to-point transmitted television in our society. For example, international satellite television links transmit live programs around the world, television networks distribute network programming to their affiliates, and weather and earth-resource satellites transmit television signals representing their pictures. Furthermore, video teleconferencing and facsimile transmission of newspapers and printed material is receiving increasing attention. In many of these applications, it is highly desirable to reduce the required transmission bandwidth or data rate to the minimum possible, in order that a satellite or other transmission link may carry the maximum number of individual television pictures. A large body of art has arisen which is directed toward schemes for coding television signals in various manners to take advantage of the redundancy of the television signals for data rate reduction, as described for example in the article "Picture Coding: A Review" by Netravali et al., published at pages 366-406 of the proceedings of the IEEE, Volume 68, No. 3, March 1980.

According to Netravali, in addition to pulse code modulation (PCM, often known simply as digital television signals), coding is classified in the major categories of (a) transform coding, (b) interpolate/extrapolate coding, (c) predictive coding and (d) miscellaneous coding. Pulse code modulation merely transforms the television signal into a digital signal, which, in general, is not a bandwidth efficient code. Transform coding breaks the television signal into blocks of data which may be considered to be subpictures, and represents the subpictures as linear combinations of certain standard sub-pictures. The proportion of each standard picture is termed a coefficient. The interpolate/extrapolate coder attempts to send certain samples to the receiver and to either interpolate or extrapolate the remainder of the samples. The miscellaneous schemes include conditional replenishment, in which individual line element sample signals from a field of information are compared with the corresponding line elements in the previous field, and the difference therebetween is tested against a fixed threshold. If the difference exceeds the threshold value the new value is encoded and transmitted to a receiving station, along with an appropriate address code, as described in U.S. Pat. No. 4,541,012 issued Sep. 10, 1985, to Tescher. In general, conditional replenishment techniques are not optimum because the addresses of the transmitted samples must be transmitted.

The predictive coding technique is effective for reducing the data rate. In predictive coding, the transmitter generates a difference or error signal for transmission to the receiver which represents the difference between a current data word representing a picture element (pixel or pel) which the transmitter is currently receiving and a reference or "predicted" data word representing a pixel which is generated by the receiver. It should be noted that the word "pixel" is often used to denote either the data word representing a pixel or the value of the data word by which a pixel is represented. The transmitter knows the value of the predicted data word or pixel in a predictive coding system, because the transmitter includes a prediction circuit which is identical to the prediction circuit in the receiver which is producing the predicted pixel. The predicted reference pixel is often a corresponding pixel from a previous frame, or a weighted linear combination of pixels lying near the corresponding pixel of either the current or the previous frame. In this context, "near" means close physical proximity in the two-dimensional picture or raster of which the pixels are a part.

FIG. 1 illustrates in block diagram form a communication system using prior art predictive coding techniques. In FIG. 1, a transmitter 10 communicates by way of a narrow bandwidth data channel 30 with a receiver 38. Transmitter 10 is coupled to a source 12 of frame-sequential, line-scanned analog television signals which applies the analog television signals to an analog-to-digital converter (ADC) 14 in transmitter 10. ADC 14 samples the analog signals, quantizes them (represents the infinite range of values by a finite set of values) and digitizes them (represents each value of the set by a different digital number) to form digital signals which are made available on a conductor 15. Those skilled in the art understand that digital signals may be in either serial or parallel form, and that serial digital signals may be carried on a single conductor (together with its associated ground), while parallel signals must be carried by a set (a plurality) of conductors. Since this is well known, no distinction is made hereinafter between single conductors and sets of conductors, unless relevant to the discussion. The digital signals produced by ADC 14 on conductor 15 are applied to the noninverting (+) input terminal of a subtracting circuit or subtractor 16 which receives a predicted signal from conductor 25 at its inverting (−) input terminal. The predicted signal applied to the inverting input terminal of subtractor 16 is subtracted from the current value of the signal then being applied to the noninverting input terminal of adder 16 from conductor 15. A difference signal is generated at the output of subtractor 16. The difference signal is often known as an error signal. Since ADC 14 quantized the signal, the error signal at the output of subtractor 16 is also quantized. While not absolutely necessary to an understanding of predictive coding systems and not essential to operation of predictive coding systems, a coarse quantizer illustrated as a block 18 is often coupled to the output of subtractor 16 to coarsely quantize the difference signal into a number of "bins". The bin is itself represented by a digital number, so the output of quantizer 18 on conductor 19 is a quantized difference signal, just as is the signal on conductor 17. The term difference (or error) signal hereinafter refers to the difference (error) signal on either conductors 17 or 19, without regard to the magnitude of the quantizing steps.

The difference or error signal on conductor 19 is applied to a predictor loop designated generally as 20. Predictor loop 20 is a replica of the circuit 40 in receiver 38 which regenerates each pixel to be displayed in succession from the signal transmitted over channel 30. Predictor loop 20 includes a summer or adder 22 which receives the difference or error signal from conductor 19. Adder 22 adds to the difference or error signal the delayed value of the predicted signal received from conductor 25 to produce a current or new predicted signal which is coupled by a conductor 23 to a predictor and delay circuit 24. Predictor and delay circuit 24 delays the new predicted signal for a predetermined length of time, and may perform other processing steps, as mentioned, such as averaging together nearby pixels. For example, the delay associated with predictor and delay circuit 24 may be one frame interval. A delay magnitude of one frame interval indicates that the intensity value of a pixel of a frame is generally expected to be the same as the value of the corresponding pixel of the preceding frame. For a still picture, this will be true for every pixel. Even in a picture having some motion, it will be true for many pixels. The new value of the predicted signal appearing on conductor 23 is a current predicted signal, which is delayed by the frame interval in predictor delay circuit 24 to become a delayed predicted signal on conductor 25. The delayed predicted signal on conductor 25 is applied to the inverting input terminal of subtractor 16 and to the input terminal of adder 22, as mentioned. As described, each pixel is characterized by a single value, which may be considered to be the luminance of a monochrome (black-and-white) picture. Those skilled in the art will realize that it may also represent the intensity of any one of a plurality of components of a color signal.

As mentioned, coarse quantizer 18 causes all input values of the difference signal to be coarsely quantized into "bins". The number of such non-zero bins is often a power of 2 such as 16 or 32. In addition to these non-zero bins, there is a center or "coring" bin into which difference signals having zero or near zero magnitude will fall, and will appear as a zero at the output of the quantizer. The designer expects that a large number, or all, of the difference pixels will fall into this coring bin. When the differences are at or near zero, this indicates that the predicted signal produced on conductor 23 at the output of adder 22 is a faithful representation of the image or picture currently to be transmitted. Subtractor 16 ordinarily receives digital signals which represent each pixel of the image to be transmitted by digital words having an arithmetic value (ordinarily expressed as the decimal value corresponding to the digital value). The arithmetic value is nominally equal to the normalized image luminance at the pixel location. The delayed predicted signal applied to the inverting input terminal of subtractor 16 from predictor and delay circuit 24 must, in order to be consistent with the digital signal representing the image which is applied to the noninverting input terminal, also represent the predicted image by the arithmetic value. Similarly, adder 22 must receive at its inputs the arithmetic value of each pixel pair to be added. The arithmetic value of each pixel is represented by the sequence of binary (two-level) logic levels (high and low, or logic one and logic zero) which appear simultaneously on each of a plurality of conductors (one "bit" for each conductor). For television signals, the number of conductors 15 connected to the non-inverting input of subtractor 16 is often eight, and the arithmetic value of a pixel is represented by one of $2^8$ or 256 possible numbers, each separate possible value corresponding to a unique distribution of logic highs and logic lows on the eight conductors. The result of the subtraction process in subtractor 16 is such that the resulting signal on conductor 17 is represented by 9 bits, or 512 possible numbers. However, the function of the coarse quantizer is to reduce the number of possible levels of the difference signal to a smaller value than 512, as for example 16 non zero bins plus the coring bin. Thus, all difference pixel arithmetic values ranging from (for example) 0 to 5 are forced by quantizer 18 to fall into the coring bin, and values ranging from 6 to 10 are forced into bin 1. Difference pixel arithmetic values of negative sign are also assigned bins. Since there are only 16 non-zero bins in this example, they can be represented by as few as 4 conductors (4 bits). If four-bit digital numbers are used to represent bins, the bin numbers are not actual arithmetic values, and cannot be applied directly to adder 22. The desire to process relatively small 4-bit "bin" numbers, coupled with the need to apply proper arithmetic values to adder 22, often results in an arrangement (not illustrated) in which the coarse quantizer has two output conductor sets, one set coupled to the adder which has a large number of conductors or bits (such as nine) for representing actual arithmetic values, and the other set having fewer conductors or bits (3 or 4) for coupling the corresponding "bin" number to a "coder". The close relationship between the arithmetic value and the bin value is known to those in the art, and the description hereinafter assumes that the quantizer has a single output which produces arithmetic values in the form of parallel 8-bit difference signals which are used by both the adder and the coder. However, the invention is not so limited, and may be used in systems in which bin numbers are used.

The difference or error signal on conductor 19 is applied, as mentioned, to a coding circuit illustrated as a coder 26. Coder 26 encodes the difference signal in known fashion, as by run length coding and/or Huffman coding. Run-length coding drastically reduces the number of bits which are required to be transmitted over data channel 30, by counting the number of successive pixels from coarse quantizer 18 which are at or near zero value (which are in the coring bin). In the above example, pixel amplitudes or values from 0 to 5 are in the first or coring bin, and are assumed to be near enough to the predicted value so that the difference signal can be zero. If prediction and delay circuit 24 is very effective, and especially if there is little motion in the television scene, it produces signal which is very similar to the signal currently to be transmitted, so the differences are mostly zero. If there are long runs (for example, A pixels in length) of zero-value differences, the run of A pixels can be represented by a single codeword which means "the current image is the same as the predicted image for these A pixels". Thus, one codeword of, say, 20 bits, can represent any number of 9-bit pixel difference values. If the run length is for example 100 pixels, the amount of data required to be transmitted to represent the image is reduced from 900 bits (9 bits per pixel × 100 pixels) to 20 bits (the number of bits in a representative maximum-length codeword). In addition to signals representing zero run lengths, signals representing the amplitudes of at least some difference pixels must be sent over channel 30 to the receiver. Such amplitudes are often coded by Huffman coding, in which the frequency of occurrence of various amplitudes or bins is evaluated, and codewords are assigned to each amplitude, with the codewords being shorter for the more frequently-occurring values and longer for infrequently-occurring amplitudes.

It should be clear that the rate of generation of codewords in coder 26 is highly variable and depends upon the picture which is represented by the signals being coded. In a completely still image, there will be very long runs of zero difference signals, which can be represented by a single codeword, which occurs at the end of the run. On the other hand, if the image is highly variable, as for example when a transition occurs between two very different scenes, each in violent motion, there will be few long runs of zeroes, and many unlike amplitude values will occur, requiring frequent generation of relatively long Huffman codewords.

In order to eliminate the variability of the data rate, a rate buffer 28 is coupled to coder 26 for receiving or being laden (loaded) with coded difference data at a variable rate, for temporarily storing the coded difference data, and for applying the coded difference data at a constant rate through channel 30 to receiver 38. This type of buffer is often known as a first-in, first-out (FIFO) memory.

Receiver 38 receives coded difference data at a constant rate from channel 30, and stores the coded difference data in a rate buffer 48. Data is supplied therefrom as required to a decoder 46, which accepts the run length and Huffman-coded difference data at a variable rate, and decodes it into difference or error signals available on conductor 59, exactly corresponding to the signals which were available on conductor 19 of transmitter 10 (except for transmission errors, which are not considered herein). The decoded difference signals are applied to an input terminal of a summer or adder 42 of a predictor loop designated generally as 40. Adder 42 adds together the difference signal appearing on conductor 59 and the delayed predicted signal appearing on conductor 45, to produce a new predicted signal on a conductor 43, which is applied to a digital-to-analog converter (DAC) 54 for generating an analog signal, which is applied to a television display circuit illustrated as a block 52 for display of the picture. The new predicted signal is also applied from conductor 43 to a predictor and delay circuit 44 which is identical to predictor and delay circuit 24 of transmitter 10. Since predictor and delay circuit 44 is identical to predictor and delay circuit 24, the new predicted signal on conductor 43 appears on conductor 45 after a corresponding delay, which in the example is one frame interval. The resulting delayed predicted signal on conductor 45 is applied to adder 42, as mentioned.

The signal on conductor 19 of transmitter 10 and the signal on conductor 59 of receiver 38 are identical (except for a time lag due to the time required for transmission therebetween), because decoder 46 performs a transformation which is the precise inverse of that performed by coder 26. Difference signals applied by conductor 19 to adder 22 are therefore identical to the signals applied from conductor 59 to adder 42, and since predictor 20 is identical to predictor 40, the new predicted signals produced on conductors 23 and 43 are identical, except for the transmission time lag. Since predictor and delay circuits 24 and 44 are identical, and each receives the new predicted signal at its input, each produces identical delayed predicted signals on its output conductor (25 and 45). Thus, transmitter 10 produces on conductor 23 a signal identical to that which receiver 38 currently produces for display. For this purpose, the term "currently" does not refer to concurrence in time, but rather to concurrence of television frame number and raster position. Consequently, transmitter 10 always has available to it at the inverting input of subtractor 16 a delayed predicted signal identical to that generated by receiver 38 for the corresponding pixel of the previous frame. Therefore, the difference signal being transmitted at any moment from transmitter 10 is the difference between the television signal then being applied on conductor 15 to subtractor 16, from which is subtracted a signal corresponding to that produced and displayed by receiver 38 for the previous frame. It should be noted that during system design experimentation relating to predictor and quantizer effects, a receiver 38 may not be used; the signal on conductor 23 of the transmitter is considered to be a replica of the signal produced on conductor 43 by such a receiver.

Predictive systems such as that illustrated in FIG. 1 can achieve very large reductions in data rate, especially on still pictures. However, when the picture has motion, the predicted signal may at times be most unlike the actual current value. When there is substantial motion in the television picture, the difference or error signals on conductor 19 tend to be large in value and to change rapidly. As mentioned, run length coding tends to be relatively less effective in reducing data rate, and Huffman coding tends to produce relatively longer code words. Since the data rate of channel 30 is preestablished and rate buffer 28 of transmitter 10 can only transmit data at the maximum rate allowed by channel 30, it is possible for rate buffer 28 to become overfull or to "overflow" when the average size of the code word length is large, and code words are applied to the rate buffer for a long period of time at a high rate. The terms "overfull" and "overflow," may not be sufficiently descriptive. The rate buffer is "laden" or loaded by the difference between the variable flow of code words into the buffer and the fixed flow of code words out of the buffer, which forms a "lading" or loading which varies with time. The capacity of the buffer is the maximum lading which it can hold. The lading may from moment to moment vary from zero (empty buffer) to the maximum capacity of the buffer (corresponding to a full buffer). Any attempt to further increase the lading beyond the maximum capacity, even by one word, creates an "overflow" condition. "Underflow" occurs when the buffer writes or attempts to write to the outside world a number of bits which exceeds the number of bits in the lading, with the result that meaningless zero values are transmitted as meaningful data. When the lading is such that underflow or overflow occurs, some code words may not be stored in rate buffer 28, or are corrupted, and are therefore lost. The loss or corruption of code words is very serious in a predictive encoding type of communication system, and leads to substantial errors in data transmission and consequent distortions of the transmitted picture.

It should be noted that the quantizer (18) in these loops is recognized as being a nonlinear element, which makes rigorous analysis difficult. Furthermore, the quantizer may have quantizing steps of different sizes, which increases the nonlinearity. However, ignoring the nonlinearity in the analysis produces results which, while not rigorous, indicate trends, and which can therefore be useful.

A known method for stabilizing the lading of the rate buffer (and therefore preventing exceeding the capacity of the buffer by underflow or overflow) is to sense the occupancy or the amount of lading of the rate buffer, and to generate a control signal in response thereto which is applied to at least one of the elements of the predictive coding system which produces the coded difference signal to reduce the rate of generation of the code words when the control signal indicates that the buffer is above or below a certain lading level.

Copending patent application Ser. No. 913,692, filed Sep. 30, 1986, entitled "Rate Buffer Control Of Difference Signal Decimation And Interpolation For Adaptive Differential Pulse Code Modulator", and Ser. No. 920,294, filed Oct. 17, 1986, and entitled "Rate Buffer Control Of Predicted Signal Decimation and Interpolation For Adaptive Differential Pulse Code Modulator", both in the name of A. A. Acampora, describe adaptive control of filters for reducing image resolution, and decimators and interpolators for reducing data rate, both under the control of the fill or occupancy of the rate buffer, for the purpose of prevention of overflow of the rate buffer at the transmitter. U.S. Pat. No. 4,093,962 issued June 6, 1978, to Ishiguro et al., describes adaptive control of the amplitude of the difference signal in response to rate buffer occupancy. U.S. Pat. No. 3,670,096 issued June 13, 1972, to Candy et al., describes a system in which a rate buffer overload signal causes encoding to stop for a period, and also causes cropping of the picture edges.

When a still image has been transmitted for a substantial time, the difference signals tend towards zero, and the encoding becomes very efficient. This efficiency results in transmission of relatively short codewords at infrequent intervals. If the scene of the image changes drastically and thereafter contains motion, large numbers of relatively large codewords are generated by coder 26, as described. These codewords are generated at the pixel clock rate, and may include codewords 10, 13 or as much as 20 bits in length. Thus, coder 26 encodes the difference signals to generate codewords during intervals in which a very high degree of image motion occurs which may have an average number of bits equal to or greater than the number of bits in uncoded, ordinary pulse code modulation (PCM). Since the codewords are relatively long and the rate of transmission over channel 30 is fixed by a modem or channel clock rate, relatively few codewords per unit time are transmitted from transmitter 10 and received at receiver 38. Consequently, during periods of intense image motion, rate buffer 38 receives on an average long codewords which represent few pixels. An unobvious problem results from this situation. The bits of the codewords must be sent from rate buffer 28 over channel 30 one at a time or serially. Thus, each long codeword may take as long as 20 modem or channel clock intervals to be transmitted through the channel and loaded into rate buffer 48 at the receiver. This time is the time required to clock rate buffers 28 and 48, excluding any transit delay time through the channel. Rate buffer 48 must form the serially received long codewords into parallel format, and supply them to decoder 46 as they are demanded by decoder 46. The demand is at the pixel clock rate, which is much higher than the channel clock rate. Decoder 46 must decode codewords supplied to it from buffer 48. The codewords may range in size up to 20 bits, and are supplied in parallel from rate buffer 48 to decoder 46. Under the described condition of intense motion, rate buffer 48 in receiver 38 may run out of codewords or underflow, and thereby not be able to supply codewords to decoder 46 fast enough to keep up with the demand. This occurs because, when codewords are long, reception by buffer 48 of each coded pixel may require as many as 20 channel clock intervals. Parallel processing cannot shorten this time, because the bits of each codeword are received at receiver 38 and rate buffer 48 sequentially, and the codeword cannot be supplied by rate buffer 48 to decoder 46 until the bits have all arrived. The basic reason that rate buffer 48 runs out of codewords is that the long codewords most often carry information relating to one or a very few pixels. Thus, the long codewords require a long transmission time (up to 20 channel clock intervals), but they tend to be read out of buffer 48 very quickly, namely at the pixel clock rate, and up to 20 at a time. Because of their length, the long codewords tend to occupy more buffer space than short codewords. Even if buffer 48 is relatively full of these long codewords, they tend to be read out so quickly (as much as 20 bits at a time, during each pixel clock cycle) that the buffer occupancy falls during the interval in which they are read out. If the rate buffer does not contain a sufficient backlog lading, the reading of the large codewords will deplete its contents to an empty condition, and then either attempt to underflow, causing errors, or be unable to supply the next pixel, which also results in errors. Since receiver 38 must generate pictures by sequentially producing pixels at the clock rate, rate buffer 48 must always have a codeword available on demand from the decoder when it is needed to produce the next pixel. If rate buffer 48 is empty at the moment of demand by decoder 46, a codeword may not become available for up to another 20 clock (pixel) intervals, and even when it completes its arrival at buffer 48 and is supplied to decoder 46, it may only satisfy the demand for one pixel or clock interval. Thus, the long codewords which occur during rapid motion of the image represented by the scene being televised may result in receiver 38 being unable to replicate in predictor and delay circuit 44 the signal stored in predictor and delay circuit 24 of the transmitter, because pixels have been corrupted or missed. It is very undesirable to allow the receiver to corrupt or to miss pixels, because in that event the predictors at the transmitter and receiver do not contain the same information, and the image displayed at the receiver will thereafter not correspond to the image being transmitted.

The above mentioned problem can be solved by keeping a long backlog, for example many frames, stored in rate buffer 48. For example, a buffer having a maximum capacity of about 20 coded average frames might keep an average backlog of 10 frames. Such a long backlog can guarantee that even for several rapid-motion frames, receiver rate buffer 48 will always have pixels available, even though its occupancy drops. However, this introduces another problem, that of delay in the transmission time. In a teleconferencing system using a satellite transmission path, a delay in each rate buffer of 10 television frame intervals, each 1/30 second long, results in an undesirably long net system delay. This can be explained by imagining a teleconferencing system in which a question is asked at one transmitter-receiver, and a reply is expected from the user of the other transmitter-receiver. The buffer at the first transmitter-receiver of the system delays by ⅓ second, and the round-trip delay to and from the satellite is about ¼ second. Thus, the image generated (and the associated sound bearing the question) at the first transmitter-receiver arrives at the second transmitter-receiver after about 7/12 of a second, but is not displayed (or heard) for another ⅓ second, so that total delay between generation of an image and its display is about one second. The return image and sound also takes about one second to be reproduced at the first transmitter-receiver. Thus, there is roughly a two-second inherent delay in such a system which is attributable to the passage of the signal through four rate buffers, even for a relatively moderate 10-frame storage in the rate buffers. In a conversational context, this is a very undesirable delay.

There is an additional unobvious problem which can occur even when there is a substantial backlog of information in the receiver rate buffer. This problem is related to the speed with which decoder 46 can decode long codewords. In principle, the decoder can operate at the pixel clock rate. In practice, it may be desirable to design decoder 46 to operate in such a manner that its average decoding speed is sufficient for typical picture content, but the decoding of very long codewords takes more than one pixel duration, and to further provide a buffer memory to temporarily store the decoded difference words and to provide them to the receiver adder at the pixel rate. Thus, even though an occasional long codeword takes more than a pixel interval to decode, the decoder buffer supplies the difference words at the pixel rate during the lag. However, for images with violent motion, a frame will arrive in which almost every coded difference signal received by decoder 46 is long, which will result the decoder lagging far behind the decoder buffer, to the point that the decoder buffer may underflow or be unable to supply difference signals at the pixel rate, which as mentioned results in erroneous displayed pictures. This problem can also be ameliorated by keeping a large backlog in the decoder buffer, but adds to the conversational delay.

Thus, there is a conflict between the need for short delays and the need to keep the receiver and/or coder buffer from running out of pixels. It is highly desirable to minimize the number of frames stored in each rate buffer in order to minimize the overall system delay. Thus, it is very undesirable to ameliorate the problem of running out of pixels in the rate buffer by increasing the average number of frames stored in the rate buffers.

SUMMARY OF THE INVENTION

Apparatus and method for communication by differential pulse code modulation includes a subtractor for subtracting delayed predicted signals from input signals to produce difference signals, and an adder for adding the difference signals to the delayed predicted signals to produce current predicted signals. A predictor at least delays the current predicted signals to produce delayed predicted signals. A coder codes the difference signals to form codewords of variable length which have a variable data rate. In order to stabilize the data rate, a rate buffer is coupled to the coder for storing the codewords temporarily and for being read at a substantially constant rate for transmission to a receiver. If the variable rate is high for a considerable period of time, the rate buffer may overflow, or the receiver buffer may tend to underflow. A control signal is generated which at least partially represents the rate of fill of the rate buffer. The rate of fill of the rate buffer is controlled by the control signal.

DESCRIPTION OF THE DRAWING

FIGS. 4a and 4b, referred to jointly as FIG. 4, are charts listing the actions ordered by fill control circuit 208 under various conditions of fill and rate-of-fill;

FIG. 5 plots trajectories of fill of buffer memory as a function of time in a system according to FIGS. 2, 3 and 4a;

DETAILED DESCRIPTION OF THE INVENTION

Figure 1:
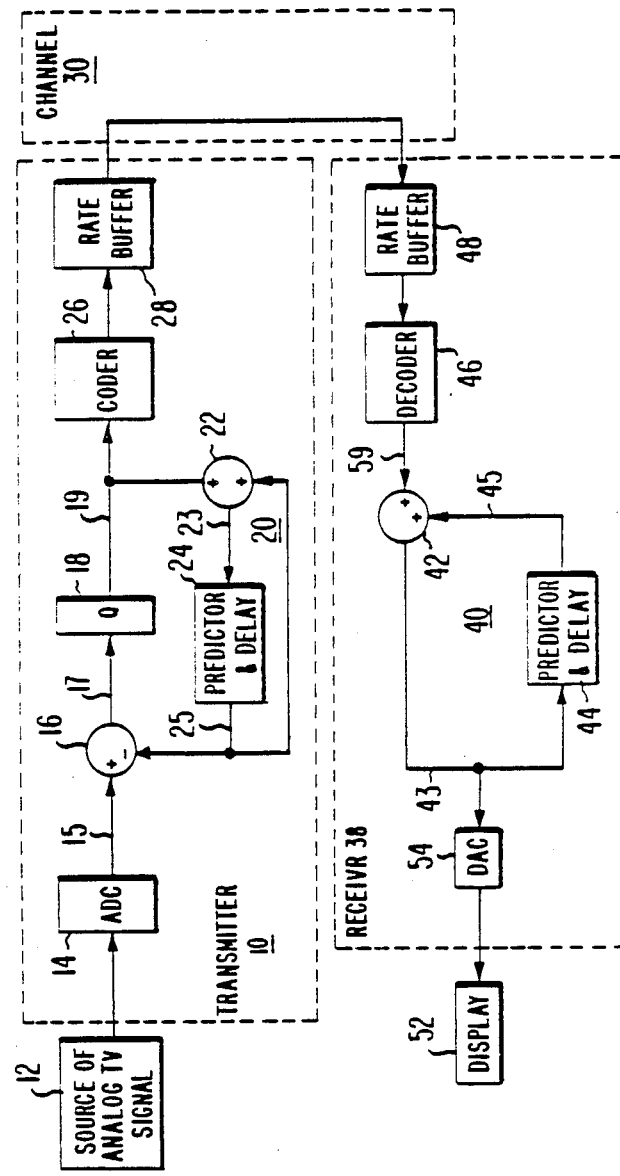
FIG. 1 is a block diagram of a data communication system using a prior art predictive coding system.
Figure 2:
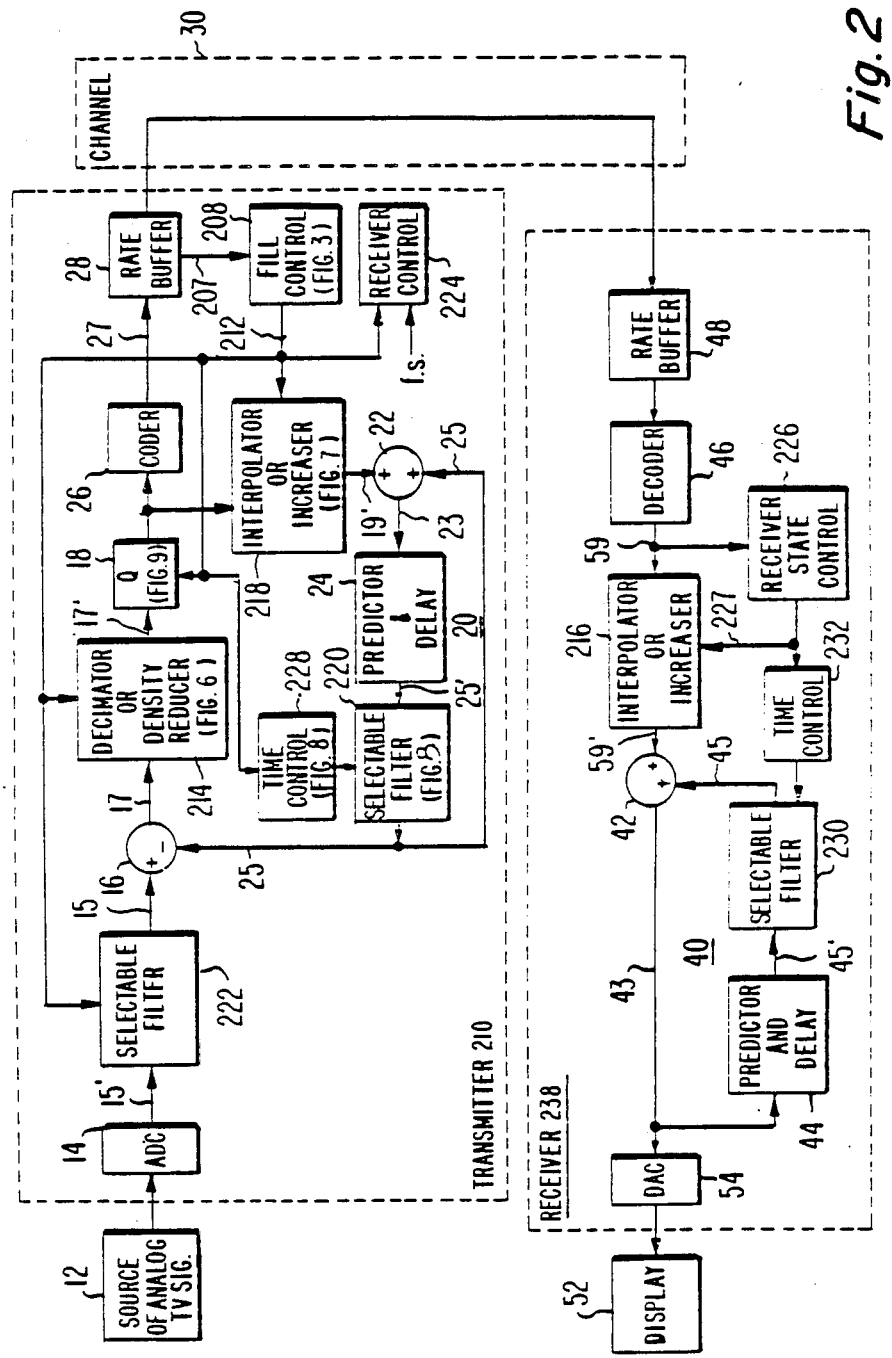
FIG. 2 is a block diagram of a communication system generally similar to that of FIG. 1, further including selectable filters arranged to filter the applied television signals, and decimators and interpolators arranged to operate on the difference signals, and including a fill control circuit coupled to the rate buffer for generating a rate-dependent control signal in accordance with the invention.

FIG. 2 is a block diagram generally similar to FIG. 1. Those elements of FIG. 2 corresponding to elements of FIG. 1 are designated by the same reference numerals. The arrangement of FIG. 2 corresponds to the arrangement described in detail in the aforementioned application Ser. No. 913,692 entitled "Rate Buffer Control Of Difference Signal Decimation And Interpolation For Adaptive Differential Pulse Code Modulator", and includes a transmitter designated generally as 210 communicating by a channel 30 with a receiver 238. In FIG. 2, a fill control circuit 208 in transmitter 210 is coupled to rate buffer 28 for generating on a conductor 212 a control signal which in accordance with the invention depends at least in part upon the rate of fill of rate buffer 28, as further described below. The control signal on conductor 212 may also be partially dependent upon the absolute amount of fill or occupancy of rate buffer 28. Coarse quantizer 18 is coupled to conductor 212 for having its quantizing characteristics selected under control of the control signal produced by fill control 208.

A decimator or data density reducer illustrated as a block 214 has its input coupled by conductor 17 to receive difference signals from subtractor 16 and has its output coupled by a conductor 17' to coarse quantizer 18. Decimator 214 is also coupled to conductor 212 for receiving control signal therefrom. Decimator 214 is intended to selectively reduce the data rate under control of the control signal on conductor 212 by decimating pixels, lines or frames. In this context, decimation means deletion of a proportion of the total number of pixel, lines or frames. Decimation of pixels or lines is termed spatial decimation, and decimation of frames is termed temporal decimation. For purposes of explanation, assume that pixels are being decimated. As a more specific example, decimator 214 could eliminate the data word corresponding to every other pixel, which would therefore reduce the true data rate by a factor of 2. This is a drastic reduction in data rate, and other reductions might be preferable, as for example elimination of one out of three (3:2) or 1 out of four (4:3) pixels. Decimators may be implemented as switches which alternately pass and block the pixels applied thereto, or they may include a sample-and-hold function operated at a clock rate lower than the clock rate of the applied signals. Such a decimator (termed a sample rate converter) for conversion of ratios of integers is described, for example, in U.S. Pat. No. 4,568,965 issued Feb. 4, 1986, in the name of Powers. Such decimators or sample rate converters do not simply delete occasional pixels, but rather produce new sets of pixels with new clock timing, so that signal is always available on each clock cycle. Thus, rather than calling such a sample rate converter a decimator, it might better be termed a data density "reducer" which reduces the sample rate or sample density. However implemented, decimator or data density reducer 214 when it is in a decimation mode reduces the true data rate being applied over conductor 17' to coarse quantizer 18 and coder 26 by an amount established by the control signal on conductor 212.

Since the purpose of the decimating scheme is to reduce the number of difference words applied to rate buffer 28 by reducing the number of words applied to coder 26, coder 26 must have at least its input clock rate adjusted in response to the selected operating mode of decimator 214, if appropriate. Since the output clocking of coder 26 is asynchronous, this clocking need not be changed in response to the operating mode of the decimator.

Decimator 214 when performing spatial decimation (pixel and/or line decimation) has an effect generally similar to that of a filter. When in such a decimation mode, decimator 214 tends to reduce the amount of high frequency data coupled through the system. To the extent that introduction of the decimator does not change the operation or timing of those elements of transmitter 210 which are downstream from the decimator, it also has no effect on receiver 238 other than affecting the high frequency content of the reproduced picture, which tends to blur the reproduced image. Since alternate pixels are being deleted in the aforementioned specific example, receiver 238 must accommodate the reduced data rate as by sample-and-holding each pixel for an additional clock period, or by interpolating each missing pixel from its neighbors in an interpolator, data rate increaser or expander. This interpolation or sample-and-hold function is performed in receiver 238 by an interpolator illustrated as a block 216.

In the arrangement of FIG. 2, a problem arises when the decimator is switched from a nondecimating mode into a decimating mode, as described in the aforementioned copending application, in that the data densities or data rates at the inputs of subtractor 16, or at the inputs of adder 22 of transmitter 210 (or 42 of receiver 238) are disparate. This problem is solved in transmitter 210 by an interpolator or data rate increaser 218 coupled by a conductor 19' between conductor 19 and adder 22. Interpolator 218 is coupled to conductor 212 for receiving control signal therefrom, for being controlled in conjunction with decimator or reducer 214, as by being energized simultaneously therewith, but to perform an inverse function. Thus, interpolator 218 produces two nonzero pixels for each pixel having nonzero value applied thereto during those times when decimator or reducer 214 reduces the data by 2:1. In the simple case of 2:1 data reduction by decimator 214, interpolator 218 might pass the undecimated difference pixels, and interpolate between the undecimated difference pixels to produce average or interpolated pixels therebetween, thereby generating an intermixture of alternating unaffected and interpolated pixels for application to adder 22. Alternatively, interpolator 218 might produce four pixels for every three pixels applied thereto when decimator or reducer 214 reduces the number of pixels by the factor 4:3. Such interpolators or increasers are known in the art. An arrangement similar to the aforementioned Powers arrangement acts as an interpolator when converting from a small sample rate to a higher sample rate. Thus, transmitter 210 of FIG. 2 receives full density data on conductor 15 for application to the noninverting input terminal of subtractor 16. The difference or error signal produced on conductor 17' (and on conductor 19 following quantizer 18) is data rate or data density reduced, and the density reduced signal is applied by way of coder 26 and rate buffer 28 to channel 30 and to receiver 238. The density reduced signal on conductor 19 is also applied to interpolator or data rate increaser 218 which restores the density and applies the restored density difference signal over conductor 19' to an input terminal of adder 22. Adder 22 also receives full density delayed predicted signals over conductor 25 from the output of predictor and delay circuit 24 (by way of filter 220), and produces full density current predicted signals on conductor 23 for application to predictor and delay circuit 24. The full density delayed predicted signals produced on conductor 25' by predictor and delay circuit 24 are also applied (by way of filter 220) to the inverting input terminal of subtractor 16, where they are subtracted from the applied signal to produce the difference signals. Subtractor 16, adder 22 and predictor and delay circuit 24 of transmitter 210 all operate at a full clock or data rate, which remains constant for all operating conditions. Nevertheless, decimated or reduced density error signals are made available on conductor 19.

Receiver 238 of FIG. 2 receives reduced density error signals from channel 30. In order to regenerate the signals in receiver 238 in exactly the fashion in which the predicted signals are generated in transmitter 210, a further interpolator or data density increaser 216 receives the data reduced signals from channel 30 by way of rate buffer 48 and decoder 46 for increasing the density in a manner identical to that by which interpolator or increaser 218 increases the density. Thus, the interpolated or density increased difference signals on conductor 59' of receiver 238 are identical to those produced on conductor 19' of transmitter 210. The remainder of prediction loop 40 of receiver 238 is identical to prediction loop 20 of transmitter 210, so loop 40 produces predicted signals on conductor 43 which are identical to the predicted signals produced on conductor 23 by transmitter 210. The predicted signals on conductor 43 are made available for display.

Interpolator 216 of receiver 238 must be switched into operation concurrently with the switching of decimator 214 of the transmitter (i.e. at the time at which the decimated frame is issued by decoder 46). In order to reduce the overhead required to be transmitted over the data channel for control of the state of interpolator 216, the control signal which commands the switching is transmitted a maximum of once each frame interval, depending upon the state of the fill control signal produced by fill control circuit 208. This function is performed in the arrangement of FIG. 2 by a block 224, which responds to the fill control signal and to other signals such as frame synchronizing (f.s.) signals to produce command words which are coupled by paths (not illustrated) to coder 26 where they are coded, and from which they pass by rate buffer 28 and channel 30 to receiver 238. At receiver 238, a state control circuit illustrated as a block 226 receives the command word or words and controls the status of interpolator 216. Such control functions are well within the skill of those in the art, and further discussion is deemed to be unnecessary.

The arrangement of FIG. 2 further includes a selectable filter 222 connected by a conductor 15' between ADC 14 and the noninverting input terminal of subtractor 16. Selectable filter 222 has a nominally infinite bandwidth (i.e. is operated in a through mode) during those intervals in which decimator or density reducer 214 does not perform decimation, in order to provide maximum bandwidth and image resolution. When decimator 214 is placed in a decimating mode, the effective sampling rate of the input signal is reduced. If the input signal includes frequency components near the sample rate, aliasing can occur which results in distortion of the reproduced image. Selectable filter 222 is switched to a filtering mode simultaneously with the switching of decimator 214 into a decimating mode, to filter the input signals to reduce the resolution of the image represented by the signals, and thereby reduce the high frequency components which might interact with the effective sampling rate to produce aliasing. Selectable filter 222 is illustrated as being connected to conductor 212 for receiving fill control signal therefrom. This connection represents control of selectable filter 222 simultaneous with decimator 214 and interpolator 218. Thus, in a nondecimating mode (if used), selectable decimator or reducer 214 does not decimate, interpolator or density increaser 218 does not increase the density, and selectable filter 222 has maximum bandpass. When fill control circuit 208 produces a control signal on conductor 212 indicating that rate buffer 28 is filling too fast, decimator 214 is set to a particular amount of data density reduction, interpolator 218 is correspondingly set to an exactly inverse data density increase, and selectable filter 222 is switched into a bandwidth limiting mode to reduce aliasing. No filter corresponding to selectable filter 222 is necessary in the receiver. The effect of spatial decimation by decimator 214 and of low-pass filtering by filter 222 is to reduce the resolution or blur the received image displayed at display 52.

When the arrangement of FIG. 2 is switched into a decimating mode from a nondecimating mode, or from one amount of decimation to a greater amount, a ghost or distorted region is produced which remains fixed in position at the location that a moving edge had at the moment of transition between modes. This ghost result from differences existing a moment after the switching between the resolutions of the images represented by the input signal applied to the inverting input terminal of subtractor 16 and the predicted signal applied to the noninverting input terminal of subtractor 16. This problem is solved by control of selectable filter 220 in transmitter 210 by means of the fill control signal on conductor 212. Selectable filter 220 preferably has filter characteristics identical to those of filter 212. The fill control signal is supplied to selectable filter 220 for control thereof by way of a time control circuit illustrated as a block 228. In operation, selectable filter 220 is switched into a band-limiting mode at the same moment that selectable filter 222 is switched into a band-limiting mode. Filter 220 reduces or eliminates the fixed ghost, but if left in-circuit results in excessive filtration of the image-representative difference signals applied to coder 26 and rate buffer 28 for transmission to receiver 38, which therefore undesirably causes excessive blurring of the reproduced image. In order to reduce the excess filtration, time control 228 causes selectable filter 220 to switch to a nominally infinite bandwidth mode at a predetermined time after it switched into a band-limiting mode. It has been found that a suitable predetermined time is about 3 frame intervals. Prediction loop 40 of receiver 238 includes a further selectable filter 230 corresponding to selectable filter 220 of transmitter 210. Selectable filter 230 is identical to selectable filter 220 and is switched into a band-limiting mode at a corresponding time, which as mentioned relates to the same frame and line number. A time control circuit 232 corresponding to time control circuit 228 is coupled to receiver state control 226 for receiving switching signals, and causes filter 230 to switch to a nominally infinite bandwidth mode at the same predetermined time after an earlier switching into a filtering mode.

Figure 3:
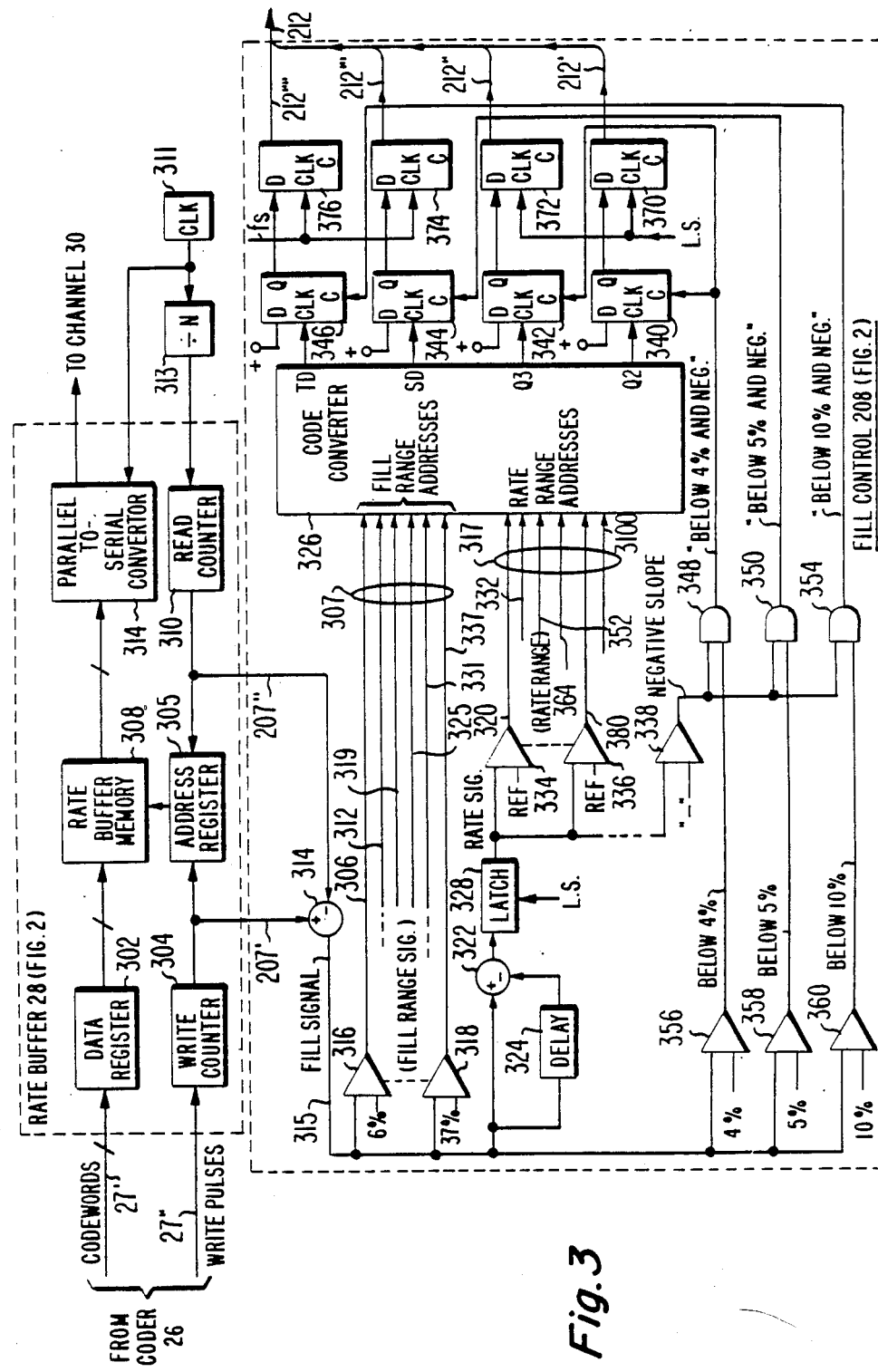
FIG. 3 is a simplified block diagram of fill control circuit 208 of FIG. 2 and its relationship to rate buffer 28.

FIG. 3 is a simplified block diagram of rate buffer 28 and fill control 208 of FIG. 2. In FIG. 3, elements corresponding to those of FIG. 2 are designated by the same reference numerals. In FIG. 3, codewords are applied at a variable rate over a conductor 27' (part of conductor 27) from coder 26 (not illustrated in FIG. 3) to a data register 302 of rate buffer 28. Concurrently with each bit of the codeword, write pulses are applied over a conductor 27" (part of conductor 27) to a write counter 304 which counts the pulses to produce a cumulative count which is applied to an address register 305 for generating addresses which increase monotonically. The monotonic increase in the count of write counter 304 terminates when write counter 304 overflows, and it begins counting once again from zero count. The overflow of write counter 304 is selected to correspond to the highest address of a rate buffer memory 308. Rate buffer memory 308 is coupled to data register 302 for accepting codewords therefrom, which are written into the location of memory 308 selected by address register 305. Thus, codewords are written into memory 308 beginning at the first address and sequentially thereafter until the last address is reached, after which writing (actually, overwriting) begins again at the first address.

A read counter 310 is coupled by a divide-by-N counter 313 to a source of clock signals 311 which produces clock signals at the rate required for transmission over channel 30. Read counter 310 counts divided clock signals to produce a read count signal which is applied by a conductor 207" to address register 305 to establish read addresses. The read addresses follow the same monotonic pattern of addressing of buffer memory 308, but at a constant rate established by clock 311 rather than at a variable rate established by write pulses from coder 26. The codewords read from buffer memory 308 are applied to a parallel-to-serial converter 314, which converts the words into serial bit form for application to channel 30.

The effective fill of buffer memory 308 is the difference between the location at which codewords are being written into the memory and the location at which stored codewords are being read from the memory, which is the difference between the write and read addresses. The write and read addresses from write counter 304 and read counter 310 are applied over conductors 207' and 207'', respectively, to the noninverting and inverting inputs, respectively, of a subtractor 314. Subtractor 314 takes the difference between the write and read addresses and produces a signal on a conductor 315 which represents the level of fill or occupancy of buffer memory 308.

The fill-representative signal on conductor 315 is applied to inputs of six comparators 316 ... 318, only the first (316) and the last (318) of which are illustrated. Comparators 316 ... 318 compare the fill-representative signal on conductor 315 with a plurality of threshold signal values representing 6%, 12%, 19%, 25%, 31% and 37% of the maximum fill of buffer memory 308. For example, comparator 316 compares the fill-representative signal on conductor 315 with a signal representing 10K bytes (each byte having 8 bits), which is about 6% of the 160K byte storage capacity of buffer memory 308. Comparator 316 produces a logic high signal on a conductor 306 when the 6% threshold is exceeded. Similarly, comparator 318 compares the fill representative signal on conductor 315 with a threshold signal representing 60K bytes, which is about 37% of the maximum capacity of memory 308, to produce a logic high signal on conductor 337 when the 37% threshold is exceed. Similarly, logic high levels appear on conductor 312 when 12% capacity is exceeded, and on conductor 319 when 19% is exceeded, etc. The fill range signals appearing on conductors 306, 312, 319, 325, 331 and 337 (referred to jointly as conductor set 307) are applied to a code converter 326 which is actually implemented as a programmable logic array but which is better understood by considering it to be a memory or ROM, the addresses of which include the fill range signals produced on conductor set 307 by comparators 316 ... 318.

The fill-representative signal on conductor 315 is also applied to the noninverting input terminal of a subtractor 322 and, by way of a delay 324, to the noninverting input terminal of subtractor 322. This arrangement produces at the output of subtractor 322 a signal representative of the rate of change of the lading or occupancy of buffer memory 308 over the delay interval of delay 324, and includes a sign bit. When delay 324 is a line delay, the signal produced by subtractor 322 represents the net number of bytes stored in rate buffer memory 308 during the preceding line interval. This signal is applied to a latch 328 which receives line sync (L.S.) signals for latching the rate-representative signal at the end of each horizontal line interval. The latched rate-representative signal is supplied to an array of six comparators 334 ... 336, only the first (334) and one of the last (336) of which are illustrated. Comparators 334 ... 336 compare the rate signals with selected reference signals representative of various threshold rates. For example, comparator 334 compares the rate-representative signal from latch 328 with a reference signal representing 20 bytes per line (each byte having, for example, 8 bits), to produce a logic high signal on a conductor 320 of conductor set 317 when the 20 byte per line threshold is exceeded. The signal on conductor 320 is applied as an address to code inverter 326. Similarly, comparator 336 compares the rate representative signal applied thereto with a reference signal representative of 80 bytes for producing a logic high level representative of a rate in excess of 80 bytes per line, which is applied over a conductor 380 of conductor set 317 to code converter 326. Other comparators (not illustrated) compare the rate representative signal with thresholds representing 32, 52, 64 and 100 bytes per line to produce on conductors 332, 352, 364 and 3100 of conductor set 317, respectively, logic signals when the thresholds are exceeded. All the rate threshold signals are applied to code inverter 326 as additional addresses.

As mentioned, code inverter 356 can be considered to be a ROM which is addressed by the logic signals from comparators 316 ... 318 and 334 ... 336. In particular, conductors of conductor set 307 are applied to the fill range address input terminals of converter 326, and conductors of conductor set 317 are applied to the rate range address input terminals. It should be noted that the signals on the various input conductors of code converter 326 are not independent. For example, if the input signal on conductor 337 is logic high, this means that the fill is greater than 37%, and therefore it is also greater than 6%, 19% ... 31%, and therefore all of the input conductors 306, 312, 319, 325 and 331 must also be at a logic high level (i.e. they may not independently be logic low under this condition). Consequently, the ensemble of logic signals available as addresses to converter 326 is much smaller than it would be if the equivalent number of conductors represented independent PCM inputs. Consequently, many of the memory locations of a ROM having the same number of input addresses cannot be addressed, and therefore the ROM is inefficiently used. However, those skilled in the art will readily understand that individualized programmable logic arrays of the type EP600 (manufactured by Alterea, the address of which is 3525 Monroe Street, Santa Clara, CA 95051) can be used instead of a ROM to perform the same function.

Code converter 326 has four output conductors or lines designated TD, SD, $Q_3$ and $Q_2$. Since there are four output conductors, each memory location must have at least four bits of storage. A logic high level at the $Q_2$ output represents a second quantizing law ($Q_2$) other than the first or basic quantizing law ($Q_1$). A logic high level at the $Q_3$ output represents a third quantizing law ($Q_3$) other than the basic quantizing law. Thus, it will be understood that at least three quantizing laws are represented by the signals at the $Q_2$ and $Q_3$ outputs of code converter 326. When $Q_2$ and $Q_3$ together output the word 00 (with $Q_3$ being the most significant bit and $Q_2$ the least significant), a basic quantizing law is to be used by quantizer 18. When the $Q_2$, $Q_3$ outputs of code converter 326 together output the word 01, the first quantizing law ($Q_2$) other than the basic quantizing law ($Q_1$) is to be used. When the $Q_2$, $Q_3$ output word is 10 (or 11), law $Q_3$ is to be used rather than either $Q_2$ or $Q_1$. The SD output of converter 326 represents by a logic low level that a basic spatial decimation law ($SD_1$) is to be used, and by a logic high level that a second law ($SD_2$) providing a greater amount of spatial decimation is to be used. Similarly, the TD output of converter 326 represents by a logic low level that a basic temporal decimation law ($TD_1$, which might be a 2:1 decimation) is to be used, and represents by a logic high level that a second temporal decimation law ($TD_2$, such as 4:1) is to be used.

FIG. 4a is a table listing the effect of a particular programming of a ROM-type code converter 326. In FIG. 4a, rows A-F represent various fill ranges, and columns II-VII represent various rates of fill. Column I sets out the fill range addresses corresponding to the percentage of fill (for example, a fill range of 6-12% is represented by the address 000 001 on conductor set 307 (FIG. 3). As mentioned, columns II through VII represent various rates of fill, and the addresses corresponding to the rate range on conductor set 317 appear in lowermost row G. Each intersection of a row A-F and a column II-VII represents by a designation $Q_2$, $Q_3$, SD, or TD, or by lack of a designation, the result required by the programming. An intersection lacking a designation represents use of a basic quantizing law ($Q_1$), a basic spatial decimation ($SD_1$), and a basic temporal decimation law ($TD_1$). In FIG. 4a, the designations $Q_2$ and $Q_3$ represent quantizing laws other than the basic quantizing law, $SD_2$ represents a second spatial decimation law, and $TD_2$ represents a second temporal decimation law. Thus, when rate buffer memory 308 is essentially empty (less than 6% full), as represented by fill range address 000 000 in column I, and the rate of fill is less than 80 bytes/line (column VII) the basic quantizing law $Q_1$, basic spatial decimation $SD_1$, and basic temporal decimation $TD_1$ are selected, as indicated by the lack of designations in row F, columns II-VI. This selection is represented by logic zero levels at the $Q_2$, $Q_3$, SD and TD outputs of converter 326. Even when buffer memory 308 is in the 0-6% full range, a rate of fill of 80 to 100 bytes/line (as represented by address 011 111 in column VII) causes a memory location to be addressed in code converter 326 which selects second quantizing law $Q_2$, as indicated by the designation $Q_2$ at the intersection of row F and column VII. This selection is represented by a logic high level on the $Q_2$ output of code converter 326 (FIG. 3), and logic zeroes at the $Q_3$, SD and TD outputs. In the highest fill range of 31 to 37%, represented by address word 011 111 as indicated in row A, Column I of FIG. 4a the basic quantizing law ($Q_1$) is not used for any rate of fill. Even at relatively low rates of fill such as 0 to 20 bytes/line, quantizing law $Q_2$ is required, as indicated by the designation $Q_2$ at row A, column II; thus at least the second quantizing law is used to tend to reduce the rate of fill when the fill exceeds 31%.

At the highest fill range (31-37%) and highest rate of fill (80-100 bytes/line) the third and most coarse quantizing law ($Q_3$) is used (as represented by the designation $Q_3$ at row A, column VII, of FIG. 4a) together with increased spatial decimation ($SD_2$) and increased temporal decimation ($TD_2$). The combination of all three maximum data reduction programs is expected not only to prevent the net buffer memory fill from increasing under worst-case motion conditions, but to actually reduce the lading of buffer memory 308 under worst-case conditions of image motion. Under these worst-case conditions, the transmitted image or picture will be degraded by comparison with the image transmitted under more still conditions, but the degradation is subjectively less noticeable during violent motion. For buffer memory occupancies in fill regions less than 31% and rates of fill less than 80 bytes/line, the selected data reductions are indicated by the designations in the appropriate intersections in the table of FIG. 4. As mentioned, code converter 326 indicates the selection of law $Q_1$ by the word 00 at the $Q_2$, $Q_3$ outputs, the selection of law $Q_2$ by the word 01, and the selection of law $Q_3$ by the word 10 (or 11). The selection of spatial decimation law $SD_1$ is indicated by a logic low level on the SD output, and $SD_2$ by a logic high level, and the $TD_1$ and $TD_2$ temporal decimations are indicated by logic low and logic high levels, respectively, at the TD output of code converter 326.

The quantizing law is changed "first", i.e. changed from $Q_1$ to $Q_2$ before the spatial and/or temporal decimation are changed away from $SD_1$ and $TD_1$, because of a subjective estimation that the "puddling" or "contouring" caused by a more coarse quantizing is less objectionable than the loss of resolution or blurriness caused by increased spatial decimation or the perceptible jerkiness of motion caused by increased temporal decimation. As between spatial and temporal decimation, a subjective judgement indicates that the effects of increased spatial decimation are less objectionable than the effects of increased temporal decimation. Other judgements can be made, resulting in different operating patterns than that illustrated in FIG. 4a.

The $Q_2$, $Q_3$, SD and TD output terminals of code converter 326 are coupled to the clock (CLK) inputs of an array of D-type flip-flops (FF) 340, 342, 344 and 346, respectively. The D inputs of FF 340-346 are coupled to a positive (+) voltage source, with the result that at the instant any one of the $Q_2$, $Q_3$, SD or TD outputs of code converter 326 goes high, its corresponding FF 340, 342, 344 or 346, respectively, produces a logic high at its Q output. Thereafter, the clock input of the FF cannot affect the Q output, so FF 340-346 act as latches, latching the logic high level applied to their D inputs. The latched outputs could be used directly for controlling the coarse quantizer, spatial or temporal decimators. However, the signals are delayed or retimed to the next following frame synchronizing (sync) signals in the case of the SD and TD signals, and the next following line sync in the case of the $Q_2$ and $Q_3$ outputs. This is accomplished by applying the Q output of each of FF 340-346 to the D input of a further D-type FF, the clock input of which is coupled to receive the appropriate sync pulse. In particular, the Q output of FF 340 is coupled to the D input of a FF 370, and the Q output of FF 342 is coupled to the D input of a FF 372. Both FF 370 and 372 receive line sync (L.S.) at their clock (CLK) inputs for retiming the $Q_2$ and $Q_3$ signals and for coupling the retimed $Q_2$ and $Q_3$ signals to conductors 212' and 212", respectively, which are part of conductor 212. Similarly, the Q output of FF 344 is coupled to the D input of a FF 374, and the Q output of FF 346 is coupled to the D input of a FF 376. Both FF 374 and 376 receive frame sync (f.s.) at their clock inputs for retiming the SD and TD signals to frame sync, and for coupling the retimed SD and TD signals to conductors 212''' and 212'''', respectively, which are also part of conductor 212 of FIG. 2.

In operation, when either a high rate of fill occurs at a low occupancy of buffer memory 308, or a moderate rate of fill occurs at high buffer memory occupancy, and for high occupancy and rate of fill, various data rate reduction mechanisms are implemented, which are calculated to ultimately reduce the buffer occupancy by reducing the rate of fill to below the rate at which buffer memory 308 empties. The rate at which buffer memory 308 empties is established by the read rate, which, in turn, is pre-established by the data rate of the channel. Thus, once the data reduction is implemented, and depending upon the moment-to-moment characteristics of the image to be transmitted, buffer memory 308 will ultimately experience a decreasing occupancy.

The decreasing occupancy represents a negative slope of the rate signal at the output of subtractor 322 and latch 328 of FIG. 3. A comparator 338 compares the rate signal with a reference signal representing a negative slope, and produces an output signal representing negative slope (or if the sign bit is separate at the output of latch 328, comparator 338 is not required). The signal representative of negative slope is applied to an input terminal of each of AND gates 348, 350 and 354. The fill-representative signal on conductor 315 is applied to inputs of a set of comparators 356, 358 and 360, which compare the fill signal with reference signals representing 4% fill, 5% fill and 10% fill, respectively, to produce fill range signals which represent occupancies below the reference percentages which are applied to inputs of AND gates 348, 350 and 354, respectively. AND gate 354 is enabled by concurrence of occupancy below 10% and a negative slope (buffer emptying) signal to produce a clear signal which is applied to the clear (C) input terminal of FF 346 for clearing FF 346, thereby setting its Q output to logic zero. The logic zero level is not applied to conductor 212'''', however, until the next following frame sync interval, because of the retiming effect of FF 376. The retimed logic zero level is coupled by FF 376 to conductor 212'''' for returning the temporal decimation to its basic TD1 law. AND gate 350 is enabled by concurrence of occupancy below 5% and decreasing occupancy of buffer memory 308 to produce a clear signal which is applied to the C input terminal of FF 344 for clearing FF 344 and for setting its Q output to logic zero. The logic zero level is retimed to frame sync by FF 374, and is coupled to conductor 212''' for returning the spatial decimation to its basic SD1 condition.

AND gate 348 is enabled by concurrence of occupancy below 4% and decreasing occupancy of buffer memory 308 to produce a clear signal which is applied to the C input terminals of F 340 and 342 for resetting their Q outputs to logic zero. The resulting logic zero signals are retimed by line sync to place conductors 212' and 212'' in a logic zero condition for selecting the basic $Q_1$ coarse quantizing law. As described below, the quantizing law change is selected in such a manner that even though changes are allowed at the transmitter at the line rate (or even more often, if desired), additional overhead is not needed for control of the receiver.

Figure 4B:
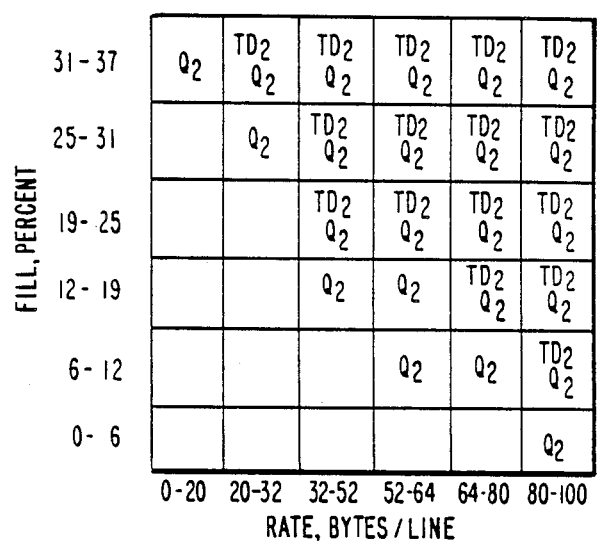
Figure 5:
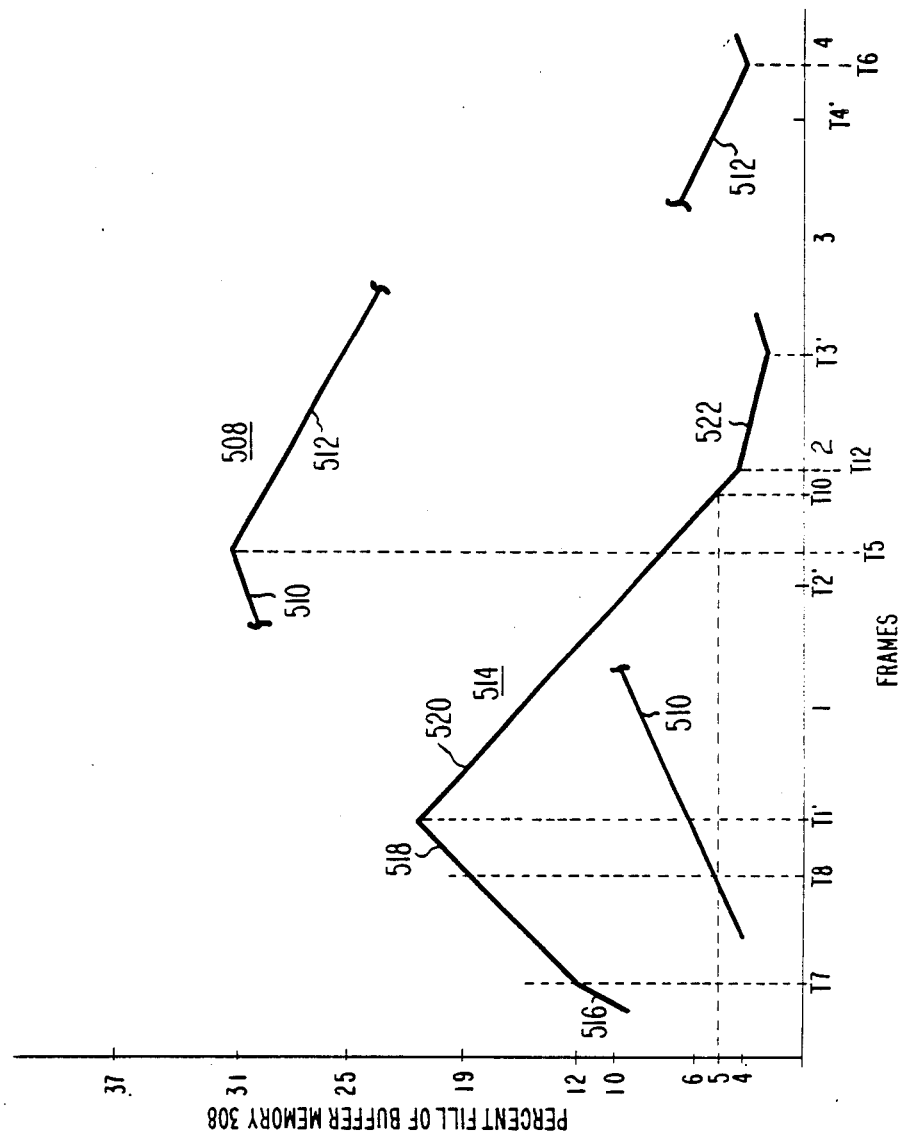

FIG. 5 illustrates several possible trajectories which the occupancy of buffer memory 308 might take as a result of normal operation of the system of FIG. 2 coupled with the fill control of FIG. 3 and the table of FIG. 4a. In FIG. 5, the ordinate represents occupancy of buffer memory 308 in percent, and the abscissa represents time, with frames designated by the numerals 1, 2, 3, and 4, and the intervening frame sync times indicated as T1', T2', T3' and T4'. The trajectories illustrated in FIG. 5 are averages, and the actual trajectories may be very erratic or noisy, and depend upon the characteristics of the image being processed. A first trajectory designated generally as 508 has a portion 510 which has a relatively low fill rate of less than 20 bytes/line, at occupancies below 10% in the vicinity of time T1'.

Referring to column II, line F of FIG. 4a, no action is required, and the system remains in the basic $Q_1$, $SD_1$ and $TD_1$ modes. In fact, column II shows that the fill can increase to 31% at a rate of rise of less than 20 bytes/line without action being taken. In FIG. 5, trajectory 510 reaches 31% occupancy at a time T5, still with a low rate of rise. From column II, line A of FIG. 4a, reaching this transition value causes the second coarse quantizing law (Q2) to be applied. The $Q_2$ law is applied at the next line sync, which is essentially immediately (time T5) to the time scale of FIG. 5. For the conditions illustrated in FIG. 5, this results in a trajectory 512 having a slow decrease in occupancy. This decrease continues until a time T6 at which time the occupancy reaches 4%, and the basic quantizing law $Q_1$ is again applied. This takes place over a period of several frames, possibly more frames than the number illustrated. For example, if the rate of fill is 20 bytes/line, each frame has 260 lines, and the buffer memory can hold 160K bytes, it takes more than 9 frame intervals to go from an empty buffer condition to a 31% occupancy condition.

A second trajectory 514 illustrated in FIG. 5 includes a portion 516 rising at 50 bytes/line until it reaches 12% occupancy at time T7, whereupon at the next following line interval quantizing law $Q_2$ is imposed, pursuant to column IV, line D of FIG. 4a. The rate of increase continues at 35 bytes/line (portion 518 of trajectory 514) until it reaches 19% occupancy at time T8, at which time, referring to column IV, line D of FIG. 4a, quantizing law $Q_2$ continues to be imposed, and spatial decimation law $SD_2$ is scheduled to be imposed at the time (T1') of the next following frame sync interval. The rate of rise continues at 35 bytes/line until time T1', at which time spatial decimation law $SD_2$ is imposed, which reduces the rate at which rate buffer memory 308 fills so that the net occupancy falls, as illustrated by line portion 520. The decrease of occupancy continues until 5% fill is reached at time T10, which schedules a change of $SD_2$ back to $SD_1$, but no change is made in the spatial decimation until the next following frame sync interval. At time T12, trajectory portion 520 reaches 4% occupancy, and at the next following line interval (essentially immediately in the time scale of FIG. 5) the quantizing law is changed from $Q_2$ to the basic $Q_1$ law. The $SD_2$ spatial decimation continues, causing the occupancy to continue to decrease along trajectory portion 522 until frame sync occurs at time T3', when the basic spatial decimation law $SD_1$ is again imposed. Occupancy thereafter may remain constant, increase or decrease, depending upon the image characteristics then prevailing.

FIG. 4b is a table similar to FIG. 4a, which has been found to be satisfactory for a system including two quantizing laws (one basic law and one other law), two temporal decimation laws, and only basic spatial decimation which does not change.

Figure 6:
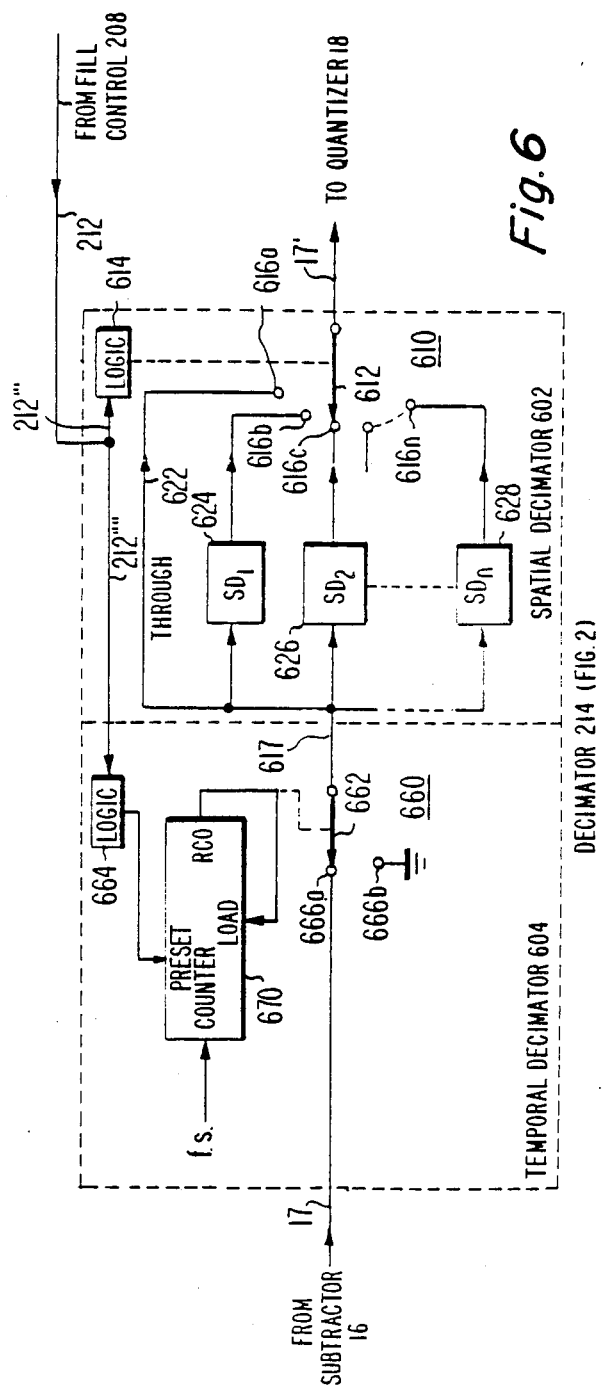
FIG. 6 is a simplified block diagram of a data density reducer or decimator useful in the arrangement of FIG. 2.

FIG. 6 is a simplified block diagram of decimator or data reducer 214 illustrated in FIG. 2, which is arranged to perform both temporal and spatial decimation. As illustrated and hereinafter described, decimator 214 is slightly more complex than is necessary to fulfill its function in the arrangement of FIGS. 2 and 3, in order to illustrate the general principles of operation. Those skilled in the art will readily understand that only two of the multiple spatial decimation functions are required to implement the embodiment described in conjunction with FIGS. 2, 3 and 4a, but that the more general aspects of the arrangement of FIG. 6 may be used for more complex embodiments. In FIG. 6, the spatial decimation portion 602 of decimator 214 includes a multiplex switch which is actually implemented in the form of an array of independent solid-state gates but which is illustrated as a mechanical switch designated generally as 610. Hereinafter, all multiplex switches are illustrated as mechanical equivalents, whatever their actual form. Multiplex switch 610 includes a controllable wiper 612, the position of which is controlled by control signals applied from fill control circuit 208 (FIG. 2) over conductor 212, by the use of a logic circuit 614 if control is to be performed by a plurality of bits. Wiper 612 can be set by logic circuit 614 to couple any one of a plurality of terminals 616a, 616b, 616c . . . 616n to output conductor 17' which is adapted to be coupled to quantizer 18 (FIG. 2). Input conductor 17 is adapted to receive difference signals from subtractor 16 (FIG. 2). The difference signals are coupled from conductor 17 through a multiplex switch 660 of the temporal decimation portion 604 of decimator 214 to conductor 617, which is the input conductor for the spatial decimation portion of decimator 214. Conductor 617 is coupled to each of terminals 616 by a separate path. The path between conductor 617 and switch terminal 616a is by way of a through path designated 622, which is a nondecimating path which might be used for the basic decimating law. A second path extends between conductor 617 and switch terminal 616b by a way of first fixed decimator 624, which is designated $SD_1$ to represent one value of decimation. Decimation law $SD_1$ might be selected to be the basic decimation used for the basic spatial decimation rather than through path 622. A path between input conductor 617 and switch terminal 616c is by way of a second fixed spatial decimator 626, labeled $SD_2$ to indicate that it has a different decimation or sample rate conversion than decimator 624. In a similar manner various other paths between conductor 617 and switch terminals 616 may be provided, including a further fixed spatial decimator 628 denominated $SD_n$ which is connected to switch terminal $616_n$. In operation, logic circuit 614 receives fill control signals over conductor 212''' of conductor set 212. If the fill control signals are simply two-level binary bits, they may be applied directly for control of wiper 612, otherwise logic circuit 614 performs one-of-N conversion or decoding in order to control the position of wiper 612, which selects the appropriate through path or spatial decimator for the fill control condition indicated by the fill control signal. To be specific, the arrangement of FIGS. 2 and 3 requires only the $SD_1$ and $SD_2$ spatial filters of FIG. 6 to perform the spatial filtering functions described in conjunction with either of FIGS. 4a or 4b, so only blocks 624 and 626 are needed for connection between conductor 617 and terminals 616 of multiplex switch 610, and the bilevel signal on conductor 212''' can control the condition of wiper 612 directly, obviating the need for logic circuit 614.

The temporal decimation aspect of decimator 214 of FIG. 6 is performed simply by forcing the difference signal (the signal on conductor 617) to equal zero during the frame being decimated. This has the effect of causing predictor loop 20 (FIG. 2) to recirculate the previous frame, and also sharply reduces the data rate, by generating a complete frame of maximum-length zero runs. Rather than reducing the data rate by generating a long string of maximum-length zero runs, the frame of all-zero differences may be further data reduced by coding as a single codeword which when received by receiver state control 226 (FIG. 2) results in issuance of an entire frame of zeroes from interpolator 216 to adder 42 of prediction loop 40, whereupon the previous frame is recirculated by prediction loop 40 and displayed by display 52. The temporal decimation portion of decimator 214 as illustrated in FIG. 6 includes multiplex switch 660, wiper 662 of which may be controlled to the position illustrated (in contact with terminal 666a) for passing difference signals from conductor 17 to conductor 617, and which may also be controlled to an alternate position (in contact with grounded terminal 666b) for coupling a logic zero to conductor 617. Wiper 662 is controlled by the ripple carry output (RCO) of a synchronous four-bit (preset) counter 670, which is synchronously preset upon the application of a logic low level to the load input terminal. The RCO output of counter 670 remains in a logic high condition until it reaches the preset count whereupon it drops to a logic zero level. The RCO output terminal of counter 670 is coupled to the LOAD input terminal. Counter 670 is preset to a predetermined count by a logic circuit 664 in response to the signal received from conductor 212'''', and which counts down towards zero count in response to a frame sync (f.s.) input. Thus, if the basic temporal decimation $TD_1$ is 2:1, and $TD_2$ is 4:1 decimation, preset counter 670 operates in the following manner.

When fill control 208 requires temporal decimation characteristic $TD_1$, logic 664 will provide a binary code of 1 to the preset inputs of counter 670. When the RCO output is low, this binary code will preset counter 670 to a count of 1 at the next f.s. clock pulse, and the RCO output will go to a logic high condition. On the following f.s. clock pulse, counter 670 will count down to zero and the RCO output will go to a logic low condition, thereby initiating repetition of the cycle. Thus, the condition of the RCO output of counter 670 will alternate between logic low and logic high on successive frames. If a logic low level of RCO closes wiper 662 to ground in contact with terminal 666b, then a temporal decimation of 2:1 will be achieved. On the other hand, when fill control 208 indicates that temporal decimation $TD_2$ is required, then logic circuit 664 will present a binary code of 3 to the preset inputs of counter 670. When RCO becomes logic low, the new binary code will preset counter 670 to a count of 3 on the next f.s. clock pulse. Successive frame sync clock pulses will cause counter 670 to count down from 3 to 2 to 1 to zero, such that RCO will be logic low for only one frame out of four, and logic high for 3 frames out of 4. Therefore, the logic high level at RCO will cause wiper 662 to be connected to ground (666b) for three frames out of four, thereby effecting a 4:1 temporal decimation. A counter 670 is implemented by a 74 Series 163 Counter (binary, synchronization with clear), manufactured by Texas Instruments Corp.

Figure 7:
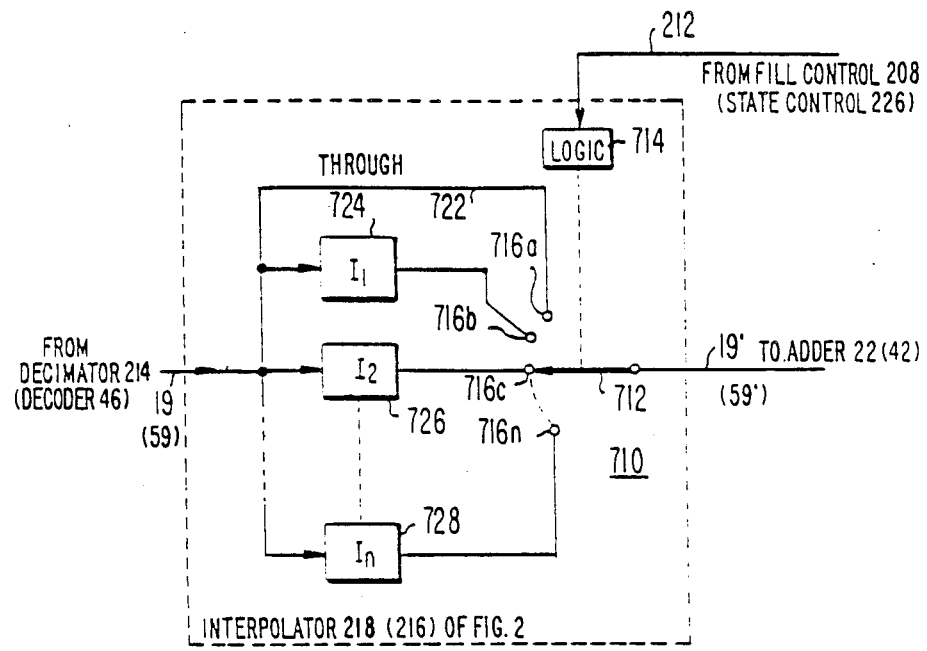
FIG. 7 is a simplified block diagram of an interpolator or data density increaser useful in the arrangement of FIG. 2.

FIG. 7 is a simplified block diagram of interpolator 218 (or 216) of FIG. 2. As with decimator 214, interpolator 218 as illustrated in FIG. 7 is slightly more complex in some aspects than necessary for use with the arrangement of FIGS. 2 and 3 functioning according to FIG. 4a or 4b, in order to illustrate general principles. The structure of interpolator 218 is generally similar to the structure of the temporal decimator portion of decimator 214. Interpolator 218 is controlled by a logic circuit 714 which is coupled to receive fill control signals over conductor 212 (or conductor 227 in the case of interpolator 216). Logic circuit 714 performs one-of-N conversion or decoding conductor 212, if necessary, and sets wiper 712 in contact with one of switch terminals 716a, 716b, 716c. . . 716n. Input conductor 19 is common to a number of paths, each of which terminates at a switch terminal 716. A first path is a through path designated 722 which terminates at switch terminal 716a. Such a through path may be selected in conjunction with the through path 622 of decimator 214 of FIG. 6. A first fixed interpolator or data density increaser 724 is designated $I_1$ and is coupled between common input conductor 19 and switch terminal 716b. Similarly, a further plurality of interpolators having different interpolation functions designated 726 . . . 728 is coupled between conductor 19 and switch terminals 716c. . . 716n, as required for operation of the system. Each of interpolators 726 . . . 728 has an interpolation function $I_1 \ldots I_n$ which is the inverse of decimation function $D_1 \ldots D_n$ of decimators 624–628. Logic circuits 714 and 614 are similarly structured so as to select corresponding decimation and interpolation functions for the same control signal conditions, or for corresponding signal from receiver state control 226, in the case of interpolator 216.

Figure 8:
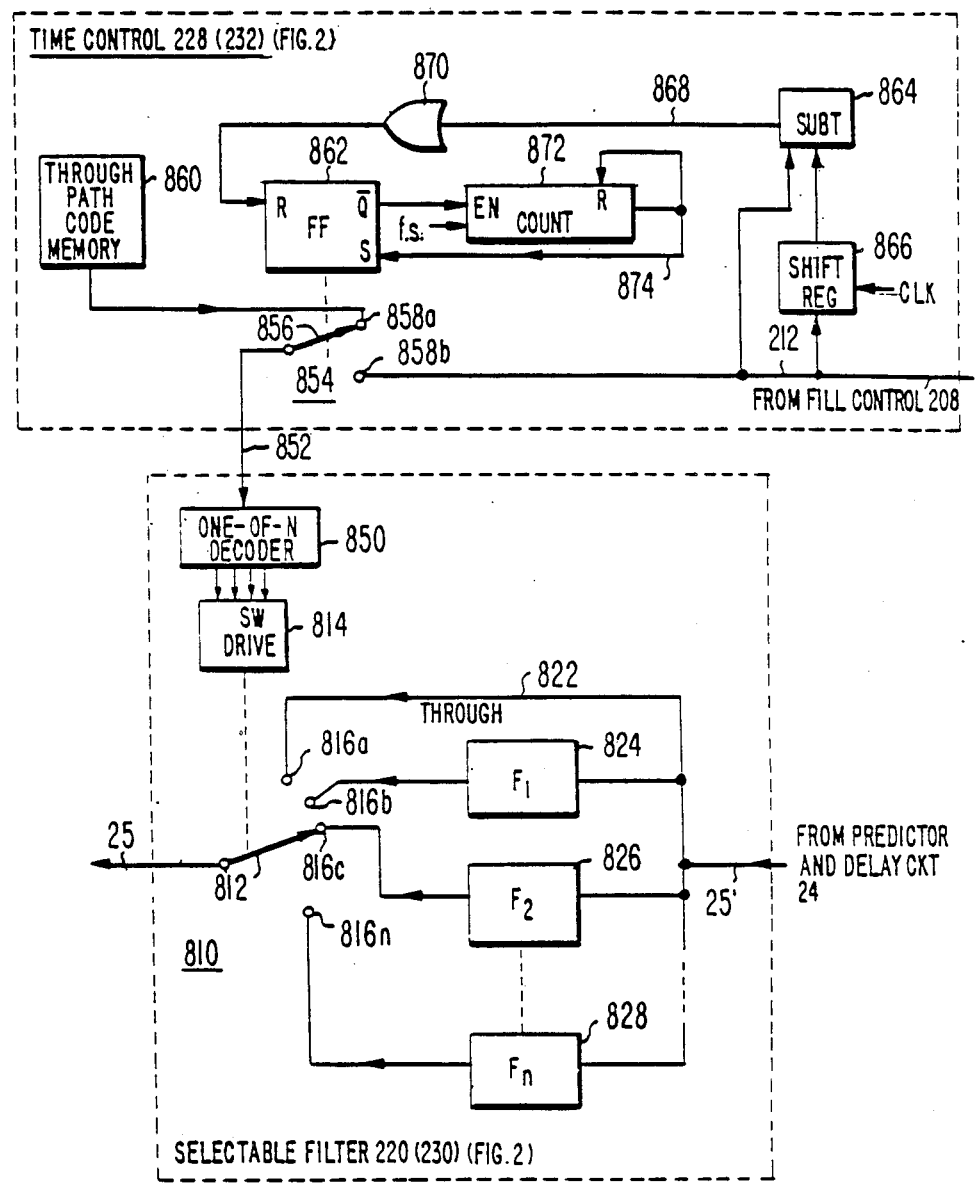
FIG. 8 is a simplified block diagram of a selectable filter and a timing apparatus useful in the arrangement of FIG. 2.

FIG. 8 is a simplified block diagram of selectable filter 220 of FIG. 2, together with time control 228. These are identical to filter 230 and time control 232, respectively, of FIG. 2. In FIG. 8, selectable filter 220 includes a multiplex switch designated generally as 810 with a movable wiper 812 controllable by a switch drive circuit 814 which connects movable wiper 812 between conductor 25 and one of a plurality of terminals 816a, 816b, 816c . . . 816n, the number of which is selected in accordance with a number of functions required. Selectable filter 220 continuously receives delayed predicted signal on common conductor 25', which is connected to each of terminals 816a . . . 816n by a separate path. A through path between conductor 25' and terminal 816a is designated 822. A first fixed low-pass filter 824 having filter function $F_1$ is connected between common conductor 25' and a second switch terminal 816b. Similarly, a plurality of further fixed filters 826 . . . 828 with filter functions $F_2 \ldots F_n$ is connected between conductor 25' and terminals 816c . . . 816n. Each of filter characteristics $F_1 \ldots F_n$ is selected in conjunction with the corresponding filtering characteristic of selectable filter 222 (FIG. 2) so as to substantially eliminate ghosting. A one-of-N decoder 850 is used, if necessary, to decode the control signal applied thereto over a conductor 852 from a multiplex switch 854, which is part of time control 228. Multiplex switch 854 includes a wiper 856 coupled to conductor 852, and also includes terminals 858a and 858b connected to a through path code memory 860 and to conductor 212, respectively. Terminal 858b receives fill control signal over conductor 212 from fill control unit 208. The position of wiper 856 of multiplex switch 854 is controlled by a flip-flop (FF) 862. FF 862 is normally in a set condition, which holds movable wiper 856 in contact with terminal 858a, for coupling a through path code from a memory 860 to one-of-N decoder 850. If conductor 212 carries only a single bit for controlling the function of selectable filter 220, through path code memory 860 may be simply a grounding connection for terminal 858a, which therefore applies a logic zero to one-of-N decoder 850 for representing the basic filter function, which as mentioned is nominally infinite bandwidth represented by through path 822. If selectable filter 220 has more than two states or filter functions, one-of-N decoder 850 is used and responds to the through path code to set wiper 812 of multiplex switch 810 in contact with conductor 816a, thereby setting selectable filter 970 into the through path condition. Thus, the normal condition of selectable filter 970 is the through condition providing nominally infinite bandwidth.

Subtractor 864 has a first input terminal coupled to conductor 212 for receiving fill control signal. Shift register 866 is coupled between conductor 212 and a second input terminal of subtractor 864. Shift register 866 delays the control signal applied to the second input terminal of subtractor 864 for one clock cycle. So long as the control signal on conductor 212 remains unchanged from clock cycle to clock cycle, the same signal is applied to both input terminals of subtractor 864, and subtractor 864 produces logic zero signal on its output conductor 868. The clock cycle may be pixel to pixel, scan line to scan line or frame to frame depending upon the design criteria. Any time a change occurs in the control signal on conductor 212, different signals are momentarily applied to the inputs of subtractor 864, which responds by producing a nonzero value on conductor 868 for application by OR gate 870 to the reset (R) input terminal of FF 862. FF 862 responds with a transition which (a) throws wiper 856 of switch 854 into contact with terminal 858b, and (b) generates a signal at its $\overline{Q}$ output which is applied to the enable (EN) input terminal of a counter 872, which also receives frame sync (f.s.) signal at an input, whereby counter 872 begins counting frame synchronization signals. Until such time as counter 872 reaches full count, fill control signals are applied from conductor 212 by way of terminal 858b and wiper 856 to one-of-N decoder 850, which responds by switching wiper 812 of switch 810 into contact with the appropriate one of terminals 816b . . . 816n, for selecting one of filter characteristics $F_1 \ldots F_n$. When counter 872 reaches the desired count, as for example the aforementioned count of three frame intervals, it produces an output signal on a conductor 874 which resets counter 872, and which is also applied to the set (S) input terminal of FF 862 to return it to the set condition. When FF 862 returns to the set condition, wiper 856 returns to contact terminal 858a, once again coupling through path code to decoder 850, which operates wiper 812 to contact terminal 816a for selecting the through path. Thus, a transition in the control signal on conductor 212 resets FF 862, allowing the control signal to be applied to one-of-N decoder 850, which sets wiper 812 to the appropriate filtering condition. After the desired number of frame intervals expire, FF 862 is set, returning multiplex switch 854 to a state in which it passes the output from through path code memory 860 to decoder 850, which responds by setting multiplex switch 810 to the through position. Naturally, selectable filter 222 of FIG. 2 may be configured much like that portion of FIG. 8 attributable to selectable filter 220.

The ranges and fill levels at which actions take place are based in part upon subjective judgements of quality, and also depend in part upon the scenes to be transmitted, so quantitative analysis is very difficult. Thus the cutoff points for action may be selected differently than those described, but in general the invention may be expected to reduce the described undesired effect at the receiver of inability of the decoder to supply difference words to the adder fast enough.

Figure 9:
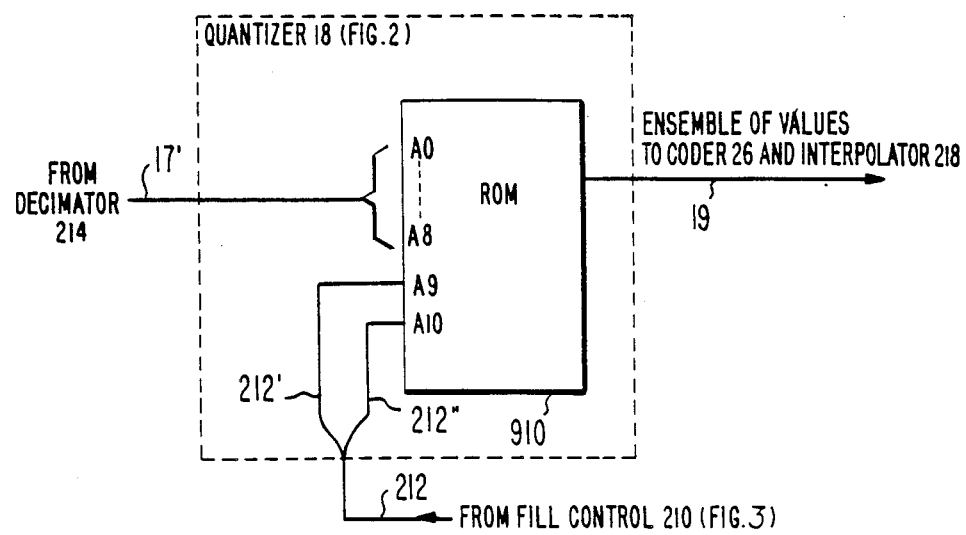
FIG. 9 is a simplified block diagram of a coarse quantizer including a ROM, which may be used with the arrangements of FIGS. 2 and 3.

FIG. 9 is a block diagram of a quantizer 18 which may be used in conjunction with the arrangement of FIG. 2 and FIG. 3. The quantizer of FIG. 9 having characteristics as described in conjunction with FIG. 10 is particularly advantageous because the ensemble of output words remains unchanged even though the coarse quantizing function changes to aid in adjusting the data rate, so that the ensemble of words to which coder 26 (FIG. 2) must respond does not require adjustment, and so that control words need not be sent from transmitter 210 to receiver 238 (FIG. 2), which would undesirably tend to increase the data rate. Details of coarse quantizer 18 and its advantageous characteristics form no part of the present invention. In FIG. 9, elements corresponding to those of FIG. 2 are designated by the same reference numeral. In FIG. 9, coarse quantizer 18 includes a read only memory (ROM) 910 having nine input addresses $A_0 \ldots A_8$, and also having page control input addresses $A_9$ and $A_{10}$. The difference word is applied over conductor 17' to addresses $A_0$–$A_8$ of ROM 910, and conductors 212' and 212" of conductor set 212 are applied to input terminals $A_9$ and $A_{10}$ respectively. Each address and page number input accesses a memory location in ROM 910 which produces a word on output conductor 19 for application to coder 26 of FIG. 2. The digital word stored at each address of ROM 910 includes a magnitude or value, a bin number, or both, as described above. As described in conjunction with FIG. 3, the fill control signals on conductors 212' and 212" may have a magnitude of logic zero or logic one, depending upon the coarse quantization law which is desired.

Figure 10A:
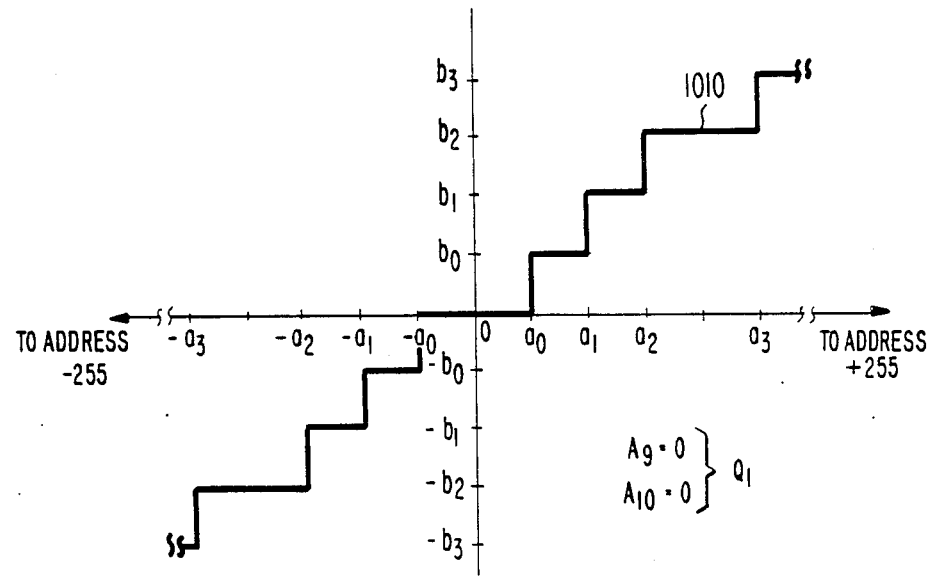
FIGS. 10a, 10b and 10c, referred to jointly as FIG. 10, represent input-output characteristics of various pages programmed into the ROM of FIG. 9.

FIG. 10a illustrates the coarse quantization law provided by the arrangement of FIG. 9 for logic zero inputs from conductors 212' and 212" to addresses $A_9$ and $A_{10}$ (i.e. for a page selection word of 00). The abscissa of FIG. 10a represents a linear scale related to the value of the digital word applied over conductors 17' to input addresses $A_0 \ldots A_8$. To be more specific, points along the abscissa designated $a_0$, $-a_0$ represent word values of $\pm 5$, points $a_1$, $-a_1$ represent $\pm 10$, points $a_2$, $-a_2$ represent $\pm 15$, and $a_3$, $-a_3$ represent $\pm 25$. As mentioned above, many other values are possible up to $\pm 255$. The abscissa of FIG. 10a represents the value of the output signal produced by ROM 910 of FIG. 9 on conductor 19. The values illustrated are $b_0 \ldots b_3$ and corresponding negative values. The $Q_1$ characteristic of quantizer 18 as illustrated in FIG. 10a is indicated by stepped line 1010. Characteristic line 1010 has an output value of zero for inputs ranging from $-a_0$ to $a_0$, so that all values of difference signals arriving over conductor 17' which lie in this range are cored or produce zero output signal. All signal input values extending from $a_0$ to $a_1$ produce the single output value $b_0$, and similarly input signals ranging from $-a_0$ to $-a_1$ produce an output signal of $-b_1$. Input signals lying within the range of $a_1$ to $a_2$ produce $b_1$ as an output signal, and corresponding negative values produce $-b_1$ as the output value. As so far described, output signals zero, $b_0$ and $b_1$ are each generated by a "bin" of positive input values in the ranges of zero to $a_0$, $a_0$ to $a_1$ and $a_1$ to $a_2$, each bin containing five input signal values (0–5, 6–10 and 11–15). The next input signal bin, however, extends from $a_2$ to $a_3$, and contains 10 input signal values. Similarly, the negative input range of $-a_2$ to $-a_3$ also includes ten values, and produces the output value of $-b_2$. Thus, the number of input signal values falling within a bin varies along the characteristic. Characteristic 1010 extends to addresses of $\pm 255$, with as many bins or steps as may be desired. Generally, the size of the bin associated with high-value input address ranges is larger (i.e. bins closer to an absolute output value of 255 contain more input signal values). Each of the output signals of ROM 910 of FIG. 9, including values zero, $b_0$, $b_1$, $b_2$, $b_3$ ... are received by coder 26 of FIG. 2 for encoding. It is extremely inefficient to provide code words for coarsely quantized difference signals which are not produced by quantizer 18. Thus, the ensemble of signals which are accepted by coder 26 of FIG. 2 corresponds exactly with the ensemble of output signals $b_0 \ldots b_3 \ldots$ produced by ROM 910.

Figure 10B:
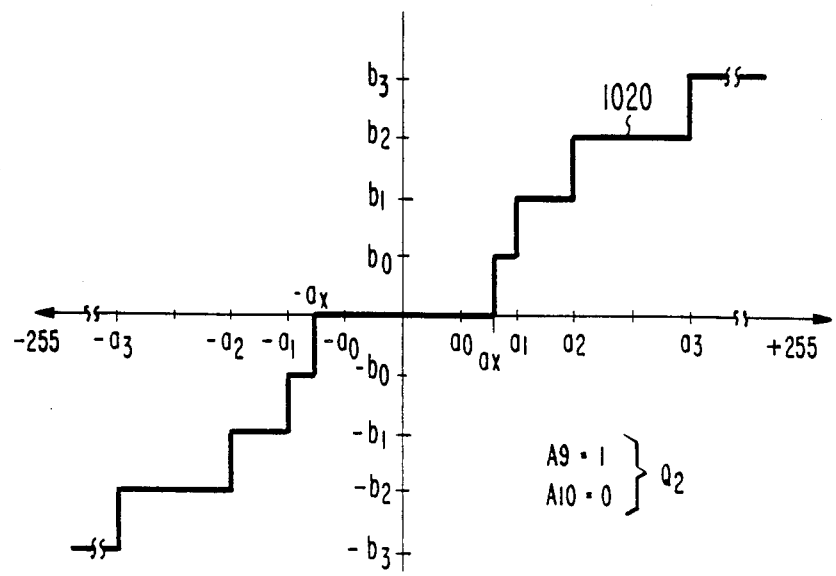

When quantizing law $Q_2$ is demanded by fill control 208 of FIG. 2, by causing the signal on conductor 212' (FIG. 3) to take on a logic high condition, ROM 910 of FIG. 9 receives a logic high at its input terminal $A_9$ which causes selection of a second "page" of the ROM, having a different characteristic, which is illustrated in FIG. 10b. The ordinate or abscissa of the plot of FIG. 10b are identical to those of FIG. 10a, but characteristic 1020 is different from characteristic 1010. In particular, the coring range in which input signals produce zero output signal is larger in characteristic 1020 than in characteristic 1010 of FIG. 10a. Characteristic 1020 has a coring region which includes input signal values of $-a_x$ to $a_x$. Input signal $a_x$ may represent the digital value eight, whereupon the coring range contains 17 values ($-8$ to $+8$ including zero) rather than only 11 values as in FIG. 10a. Thus, more values of the input difference signal may be expected to fall within the coring range, and run lengths will tend to be longer, which results in transmission of fewer codewords to rate buffer 28 of FIG. 2. The remainder of characteristic 1020 is identical to characteristic 1010 of FIG. 10a.

Figure 10C:
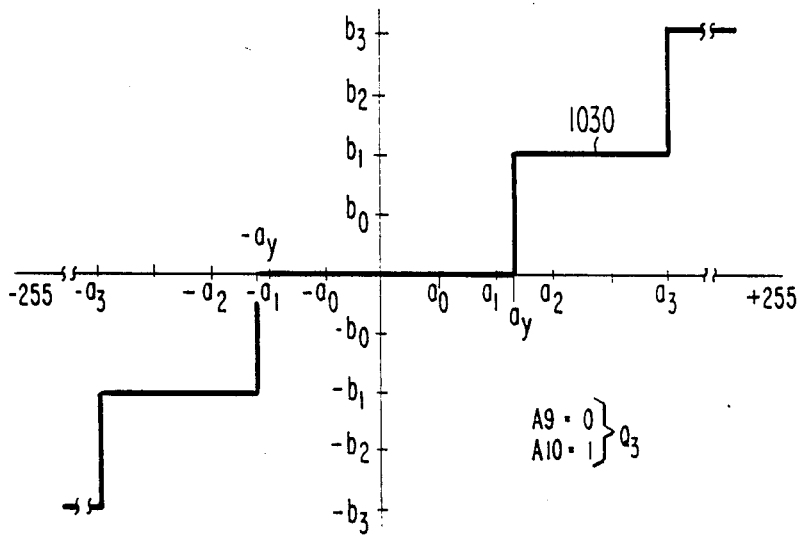

When fill control 208 of FIG. 2 demands coarse quantizing characteristic Q3, it does so by producing a logic high level on conductor 212" (FIG. 3) and a logic low level on conductor 212'. With this combination of page select input addresses at terminals $A_9$ and $A_{10}$, ROM 910 (FIG. 9) selects another set of addresses providing characteristic 1030 as illustrated in FIG. 10c. In FIG. 10c, the ordinate and abscissa are identical to those of FIGS. 10a and 10b. As illustrated in FIG. 10c, the coring range extends from $-a_y$ to $a_y$, which encompasses 25 input values ($\pm 12$ and zero). Thus, even more values of input difference signals will fall into the coring range and produce a zero output signal, thereby providing, on the average, even longer zero run lengths and more data compression. It will further be noticed that there is no value of input signal which produces output signals having values $b_0$ or $b_2$. Thus, coarse quantizing characteristic 1030 of FIG. 10c includes only output values which occur in the complete ensemble of output values zero, $b_0 \ldots b_3 \ldots$ but deletes some values of the ensemble, namely $b_0$ and $b_2$ (and possibly other values which are not illustrated). This has an effect on the data rate. Since values $b_0$ and $b_2$ do not occur in the ensemble of outputs when using the Q3 characteristic, values such as $b_1$, $b_3$ and the coring value (zero) occur more often. Since values of $b_1$ and $b_3$ occur more often in the Q3 characteristic, they occur more often in the overall characteristic which includes the Q1, Q2 and Q3 characteristics. Consequently, values $b_1$ and $b_3$ are represented in the Hoffman coding by shorter code words than they might have if values $b_2$ and $b_4$ were not deleted in the Q3 characteristic. Thus, when maximum data compression is required and the Q3 characteristic is selected, relatively shorter code words, on the average, are produced by coder 26 of FIG. 2 for application to rate buffer 28 of FIG. 2, and the shorter code words result in higher channel throughput and thereby ameliorate the inability to supply words quickly enough to decoder 46 from rate buffer 48 (and from decoder 46) of receiver 238 of FIG. 2. Furthermore, the fact that quantizing laws, Q1, Q2 and Q3 as illustrated in FIG. 10 all produce the same the ensemble of output words (although with deletions for some modes), the ensemble of words to which coder 26 of FIG. 2 responds does not require additions, and overhead need not be used to transmit code change information to decoder 46 of receiver 238. This results in a reduction in the overhead required to be transmitted, which is especially important when increased data compression is requested.

Figure 11:
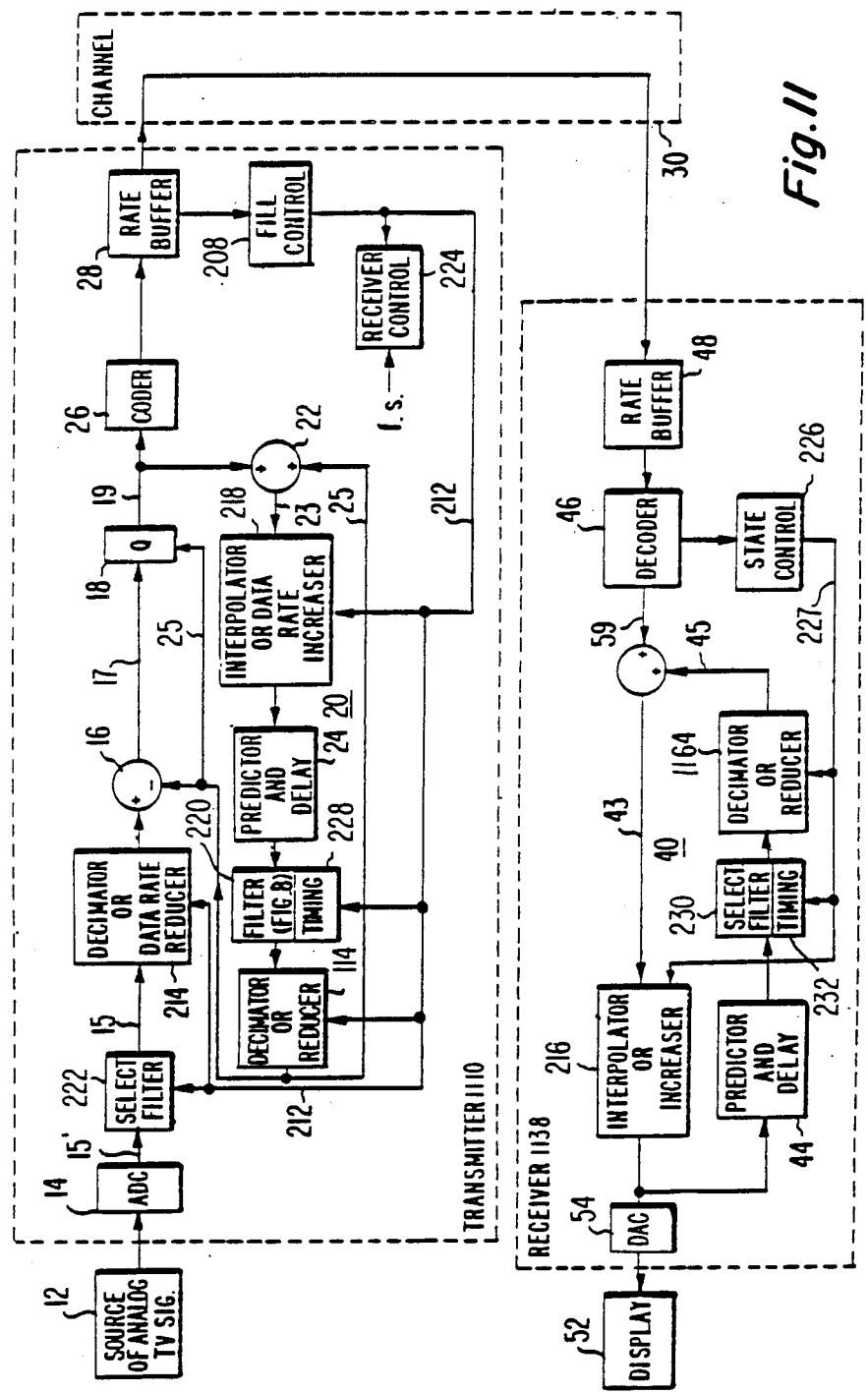
FIG. 11 is a simplified block diagram of an arrangement similar to that of FIG. 2 but with different locations of the decimators and interpolators.

FIG. 11 illustrates another embodiment of the invention. The arrangement of FIG. 11 is similar to the arrangement of FIG. 2, but the locations of decimator 214 and interpolator 218 in transmitter 210 are different, and a further decimator 1114 is added. Also, the location of interpolator 216 of receiver 1138 is changed, and a decimator 1164 is added, as described in detail in the aforementioned U.S. application Ser. No. 920,294, filed Oct. 17, 1986, in the name of Acampora. Insofar as the invention is concerned, the arrangement of FIG. 11 operates in a manner similar to that of FIG. 2 for correcting the same problem; only the location of the data rate control element is changed.

Other embodiments of the invention will be apparent to those skilled in the art. For example, the system as described includes a single transmitter and receiver, but a plurality of receivers can be used with each transmitter. Many of the functions which have been described may be implemented by both analog and digital embodiments. The "bins" into which quantizer 18 forces the signal may be of equal or unequal sizes. Filters described as using multiplex switches to switch among a plurality of fixed characteristic filters may instead be single structures internally reconfigurable for different weighting functions. Similarly, decimators and interpolators, which have been described as using multiplex switches to switch among a plurality of fixed characteristic decimators and interpolators, may instead be single units which are internally reconfigurable by logic to perform the desired function. Channel 30 may include modulators or demodulators for transmitting the signals by modulated light over fiber-optic cables, by terrestrial or satellite electromagnetic transmissions, over coaxial cable or microwave links, etc. The data may be encoded with overhead other than that described, as for example cyclic redundancy or other error correction or detection codes. In the arrangement of FIGS. 2 or 11, it is not necessary that filters 220 and 230 be switched into operation when the mode of operation is changed from a decimating mode to a nondecimating mode or to a mode of lesser decimation; thus when rate buffer 28 (FIGS. 2 or 11) is well emptied, the amount of decimation may be reduced, and the bandwidth of filter 222 correspondingly increased, without switching filters 220 and 230 into a bandlimiting mode. While the arrangement of FIG. 6 illustrates the temporal decimation portion 604 of decimator 214 as preceding spatial decimator 602, their order may be reversed, and even further, the temporal decimation function may instead follow coarse quantizer 18.

What is claimed is:

1. A method for communication by differential pulse code modulation, comprising the steps of:
   subtracting delayed predicted signals from input signals to produce difference signals;
   adding said difference signals to said delayed predicted signals to produce current predicted signals;
   at least delaying said current predicted signals to produce said delayed predicted signals;
   coding said difference signals to form codewords of variable length having a variable data rate;
   applying said codewords to a rate buffer at least part of the time for temporarily storing said codewords;
   reading said codewords from said rate buffer;
   generating a control signal representing the rate of fill of said rate buffer; and
   controlling the rate of fill of said rate buffer by means including said control signal.

2. A method according to claim 1 further comprising the step of coarsely quantizing said difference signals.

3. A method according to claim 1 wherein said coding step comprises at least one of the steps of Huffman coding and run-length coding.

4. A method according to claim 1 further comprising the step of controlling said applying step by means of said control signal.

5. A method according to claim 1 further comprising the steps of:
   coarsely quantizing said difference signals according to one of a plurality of quantizing laws; and
   in said coarsely quantizing step, controlling the selection of quantizing law by means of said control signal.

6. A method according to claim 1 further comprising the steps of:
   controllably decimating, by one of a plurality of decimating laws, one of said input signals and said difference signals; and
   controlling, by means of said control signal, the selection of the decimation law selected in said controllably decimating step.

7. A method according to claim 6 wherein said input signals are television signals representing an image, and further comprising the steps of:
   low-pass filtering at least some of those signals preceding said step of controllably decimating, for reducing the resolution of the image represented by said television signals; and
   controlling said low-pass filtering step by means of said control signal.

8. A method according to claim 1 wherein:
   said step of applying said codewords to a buffer comprises the step of identifying said codewords by a first sequential number as they are temporarily stored; and
   said step of reading said codewords from said buffer comprises the step of reading according to a second sequential number.

9. A method according to claim 8 wherein said step of generating a control signal comprises the steps of:
   subtracting said second sequential number from said first sequential number to produce a fill-representative signal;
   delaying said fill-representative signal to produce relatively delayed signals; and
   taking the difference between said relatively delayed signals to produce a rate-representative signal representative of said rate of fill of said rate buffer.

10. A method according to claim 9 further comprising the step of comparing said rate-representative signal with at least one reference value.

11. A method according to claim 9 further comprising the step of:

combining said fill-representative signal with said rate-representative signal to produce said control signal.

12. Apparatus for differential pulse code modulation of input signals representing data, comprising:

subtracting means adapted for receiving said input signals for subtracting delayed predicted signals therefrom for producing difference signals;

adding means coupled to said subtracting means for receiving said difference signals therefrom, and for adding said difference signals to said delayed predicted signals for producing current predicted signals;

prediction means coupled to said adding means for receiving said current predicted signals therefrom for delaying said current predicted signals for producing said delayed predicted signals, and coupled to said subtracting means for coupling said delayed predicted signals thereto;

coding means coupled to said subtracting means for receiving said difference signals therefrom for coding said difference signals for producing coded signals at a variable rate;

rate buffer means coupled at least to said coding means and adapted for receiving at least said coded signals for temporarily storing signals to produce stored signals, and for producing said stored signals at an output terminal;

rate control signal generating means coupled to said rate buffer means for generating a first control signal at least partially representative of the fill rate of said rate buffer means; and control means coupled to said rate control signal generating means for receiving said first control signal for, under the control of said first control signal, controlling the rate at which signals are applied to said rate buffer for controlling the rate of fill of said rate buffer means.

13. Apparatus according to claim 12 further comprising coarse quantizing means coupled to said subtracting means for coarsely quantizing said difference signals.

14. Apparatus according to claim 13 wherein said control means comprises controllable means coupled to said coarse quantizing means and to said subtraction means for controlling the coarse quantizing of said difference signals in a manner controlled by said first control signal.

15. Apparatus according to claim 12 wherein said coding means produces said coded signals by means including at least one of a Huffman coder and a run length coder.

16. Apparatus according to claim 12 wherein said control means comprises controllable decimating means coupled to said subtracting means for decimating said input signals in a manner controlled by said first control signal.

17. Apparatus according to claim 12 wherein said control means comprises controllable decimating means coupled to said subtracting means for decimating said difference signals in a manner controlled by said first control signal.

18. Apparatus according to claim 16 wherein said data represents an image and said input signals are television signals, and further comprising low-pass filter means coupled to said controllable decimating means for controllably reducing the resolution of said image under the control of said first control signal for reducing aliasing of the image represented by said stored signal produced at said output terminal of said rate buffer means.

19. Apparatus according to claim 17 wherein said data represents an image and said input signals are television signals, and further comprising low-pass filter means coupled to said controllable decimating means for controllably reducing the resolution of said image under the control of said first control signal for reducing aliasing of the image represented by said stored signal produced at said output terminal of said rate buffer means.

20. Apparatus according to claim 12, wherein said rate control signal generating means further comprises:

buffer memory means coupled to said coding means for receiving said coded signals therefrom for temporarily storing said coding signals at memory locations identified by sequential write addresses, and for reading said coded signals from memory locations identified by sequential read addresses;

first differencing means coupled to said buffer memory means for taking the difference between currently active read and write address to generate a fill-representative signal;

delay means coupled to said first differencing means for receiving said fill-representative signals therefrom for generating delayed fill-representative signals; and second differencing means coupled to said first differencing means and to said delay means for taking the difference between said fill-representative signals and said delayed fill-representative signals to produce a rate signal representative of the rate at which said buffer memory is filling.

21. Apparatus according to claim 20 further comprising threshold means coupled to said first differencing means for quantizing said rate signal.

22. Apparatus according to claim 20 further comprising:

combining means coupled to said first and second differencing means for combining said rate signal and said fill-representative signals to produce said first control signal.

* * * * *